(12) United States Patent
Muraoka et al.

(10) Patent No.: US 11,541,737 B2
(45) Date of Patent: Jan. 3, 2023

(54) GAS DETECTION DEVICE, GAS DETECTION SYSTEM, FUEL CELL VEHICLE, AND GAS DETECTION METHOD

(71) Applicant: Panasonic Intellectual Property Management Co., Ltd., Osaka (JP)

(72) Inventors: Shunsaku Muraoka, Osaka (JP); Kazunari Homma, Kyoto (JP); Koji Katayama, Nara (JP); Zhiqiang Wei, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 800 days.

(21) Appl. No.: 16/471,913

(22) PCT Filed: Dec. 18, 2017

(86) PCT No.: PCT/JP2017/045246
§ 371 (c)(1),
(2) Date: Jun. 20, 2019

(87) PCT Pub. No.: WO2018/123673
PCT Pub. Date: Jul. 5, 2018

(65) Prior Publication Data
US 2019/0383690 A1 Dec. 19, 2019

(30) Foreign Application Priority Data

Dec. 28, 2016 (JP) .............................. JP2016-256143

(51) Int. Cl.
*G01M 3/16* (2006.01)
*G01N 27/04* (2006.01)
(Continued)

(52) U.S. Cl.
CPC .................. *B60K 1/04* (2013.01); *G01M 3/16* (2013.01); *G01N 27/045* (2013.01); *G01R 27/22* (2013.01);
(Continued)

(58) Field of Classification Search
CPC ......... B60K 1/04; G01M 3/16; G01N 27/045; G01R 27/22; H01M 8/1246; H01M 2250/20
See application file for complete search history.

(56) References Cited

U.S. PATENT DOCUMENTS

2007/0209937 A1* 9/2007 Hoagland .......... G01N 33/0073
204/424
2013/0250658 A1 9/2013 Wei et al.
(Continued)

FOREIGN PATENT DOCUMENTS

CN 201629027 U * 11/2010
CN 107315034 A 11/2017
(Continued)

OTHER PUBLICATIONS

International Search Report issued in Application No. PCT/JP2017/045246 dated March 6, 2018, with English translation.
(Continued)

*Primary Examiner* — Feba Pothen
(74) *Attorney, Agent, or Firm* — McDermott Will & Emery LLP

(57) ABSTRACT

Provided is a gas detection device that includes a gas sensor, a power supply circuit that applies voltage to the gas sensor, and a control circuit that determines whether a leak of gas is present. The power supply circuit includes a reset power source that generates a first voltage, and a detection power source that generates a detection voltage for measuring resistance of a metal-oxide layer of the gas sensor. When a
(Continued)

value of a current flowing through the metal-oxide layer is a predetermined value ITH or greater, the reset power source applies the first voltage to the gas sensor to perform a reset of resetting the metal-oxide layer of the gas sensor to a high-resistance state, and the control circuit determines that a leak of gas is present, depending on a state in which the reset is performed after the reset is performed for the first time.

18 Claims, 13 Drawing Sheets

(51) Int. Cl.
  *G01R 27/22* (2006.01)
  *H01M 8/1246* (2016.01)
  *B60K 1/04* (2019.01)
(52) U.S. Cl.
  CPC ...... *H01M 8/1246* (2013.01); *H01M 2250/20* (2013.01)

(56) References Cited

U.S. PATENT DOCUMENTS

| | | |
|---|---|---|
| 2013/0311108 A1 | 11/2013 | Stetter et al. |
| 2017/0131227 A1 | 5/2017 | Homma et al. |
| 2017/0307557 A1 | 10/2017 | Muraoka et al. |

FOREIGN PATENT DOCUMENTS

| | | | |
|---|---|---|---|
| GB | 2182448 B | | 1/1989 |
| JP | S59-58348 A | | 4/1984 |
| JP | S61-191954 A | | 8/1986 |
| JP | H07209234 A | * | 8/1995 |
| JP | H11-66464 A | | 3/1999 |
| JP | 2003-240746 A | | 8/2003 |
| WO | 2013/051267 A1 | | 4/2013 |

OTHER PUBLICATIONS

Chinese Office Action and Search Report dated May 19, 2021 issued in corresponding Chinese Patent Application No. 201780080428.3; with partial English translation.
International Search Report (ISR) dated Mar. 6, 2018 in International (PCT) Application No. PCT/JP2017/045247, with English translation.
J. Yu et al., "Hydrogen gas sensing properties of Pt/Ta2O5 Schottky diodes based on Si and SiC substrates", Sensors and Actuators A: Physical, 172 (2011), pp. 9-14.
Notice of Allowance issued in U.S. Appl. No. 16/471,864, dated Sep. 21, 2022.
Non-Final Office Action issued in U.S. Appl. No. 16/471,864, dated Jul. 26, 2022.

* cited by examiner

GAS DETECTION DEVICE, GAS DETECTION SYSTEM, FUEL CELL VEHICLE, AND GAS DETECTION METHOD

RELATED APPLICATIONS

This application is the U.S. National Phase under 35 U.S.C. § 371 of International Application No. PCT/JP2017/045246, filed on Dec. 18, 2017, which in turn claims the benefit of Japanese Application No. 2016-256143, filed Dec. 28, 2016, the disclosures of which are incorporated by reference herein.

TECHNICAL FIELD

The present disclosure relates to a gas detection device including a gas sensor, a gas detection system, a fuel cell vehicle, and a gas detection method.

BACKGROUND ART

PTL 1 discloses a gas sensor that detects, as a change in a resistance value, a presence of gas containing hydrogen atoms (hydrogen-containing gas). The gas sensor includes a thin-film semiconductor layer on a substrate. The thin-film semiconductor layer includes, for example, metal oxides such as a tin oxide, a zinc oxide, a tungstic oxide, a titanium oxide, a ferric oxide, and a magnesium oxide. Hydrogen containing gas deoxidizes these metal oxides, and this causes a change in a resistance value of the gas sensor.

CITATION LIST

Patent Literature

PTL 1: Japanese Unexamined Patent Application Publication No. 61-191954

SUMMARY OF THE INVENTION

Technical Problem

The present disclosure provides a gas detection device, a gas detection system, a fuel cell vehicle, and a gas detection method capable of inhibiting error detection of hydrogen-containing gas.

Solutions to Problem

A gas detection device according to one aspect of the present disclosure includes: a gas sensor; a power supply circuit that applies a predetermined voltage to the gas sensor; and a determiner that determines whether a leak of gas is present. The gas sensor includes: a first electrode; a second electrode; a metal-oxide layer that is disposed between the first electrode and the second electrode, and includes a bulk region and a local region surrounded by the bulk region, the local region having a degree of oxygen deficiency higher than a degree of oxygen deficiency of the bulk region; and an insulating film that covers the first electrode, the second electrode, and the metal-oxide layer, and has an opening that exposes part of a main surface of the second electrode. The metal-oxide layer has reversible resistance change characteristics of transitioning from a low-resistance state to a high-resistance state by a first voltage being applied, and transitioning from the high-resistance state to the low-resistance state by a second voltage being applied, the second voltage being different from the first voltage. A resistance value of the metal-oxide layer decreases when the gas contacts the second electrode, the gas containing hydrogen atoms. The power supply circuit includes a first power supply circuit that generates the first voltage, and a second power supply circuit that generates a detection voltage for measuring the resistance value of the metal-oxide layer. The power supply circuit applies the first voltage between the first electrode and the second electrode by the first power supply circuit to perform a reset of resetting the metal-oxide layer to the high-resistance state, when a current flowing through the metal-oxide layer has a predetermined value or greater. The determiner determines that a leak of the gas is present, depending on a state in which the reset is performed after the reset has been performed for a first time.

A gas detection system according to one aspect of the present disclosure includes: the gas detection device having the above-described features; a wireless interface circuit that is connected to the gas detection device and wirelessly communicable with an external device; and an access device that obtains, through wireless communication, the resistance value of the metal-oxide layer in the gas detection device via the wireless interface circuit.

A fuel cell vehicle according to one aspect of the present disclosure includes: a passenger compartment; a gas tank compartment in which a hydrogen gas tank is placed; a fuel cell compartment in which a fuel cell is placed; and the gas detection device having the above-described features. The gas detection device is placed in at least one of the gas tank compartment or the fuel cell compartment.

A gas detection method according to one aspect of the present disclosure is a gas detection method using a gas sensor. The gas sensor includes: a first electrode; a second electrode; a metal-oxide layer that is disposed between the first electrode and the second electrode, and includes a bulk region and a local region surrounded by the bulk region, the local region having a degree of oxygen deficiency higher than a degree of oxygen deficiency of the bulk region; and an insulating film that covers the first electrode, the second electrode, and the metal-oxide layer, and has an opening that exposes part of a main surface of the second electrode. The gas detection method includes: detecting gas containing hydrogen atoms by detecting a decrease in a resistance value of the metal-oxide layer; after the detecting of the gas, applying a predetermined voltage between the first electrode and the second electrode to perform, for a first time, a reset of increasing the resistance value of the metal-oxide layer; and determining that a leak of the gas is present, when the reset is performed again within a predetermined period after the reset has been performed for the first time.

A gas detection method according to one aspect of the present disclosure is a gas detection method using a gas sensor. The gas sensor includes: a first electrode; a second electrode; a metal-oxide layer that is disposed between the first electrode and the second electrode, and includes a bulk region and a local region surrounded by the bulk region, the local region having a degree of oxygen deficiency higher than a degree of oxygen deficiency of the bulk region; and an insulating film that covers the first electrode, the second electrode, and the metal-oxide layer, and has an opening that exposes part of a main surface of the second electrode. The gas detection method includes: detecting gas containing hydrogen atoms by detecting a decrease in a resistance value of the metal-oxide layer; after the detecting of the gas, applying a predetermined voltage between the first electrode and the second electrode to perform, for a first time, a reset of increasing the resistance value of the metal-oxide layer; and determining that a leak of the gas is present, when the reset is performed again a predetermined number of times within a predetermined period after the reset has been performed for the first time.

Advantageous Effect of Invention

A gas detection device, a gas detection system, a fuel cell vehicle, and a gas detection method according to one aspect of the present disclosure are capable of inhibiting error detection of hydrogen-containing gas.

Figure 1A:
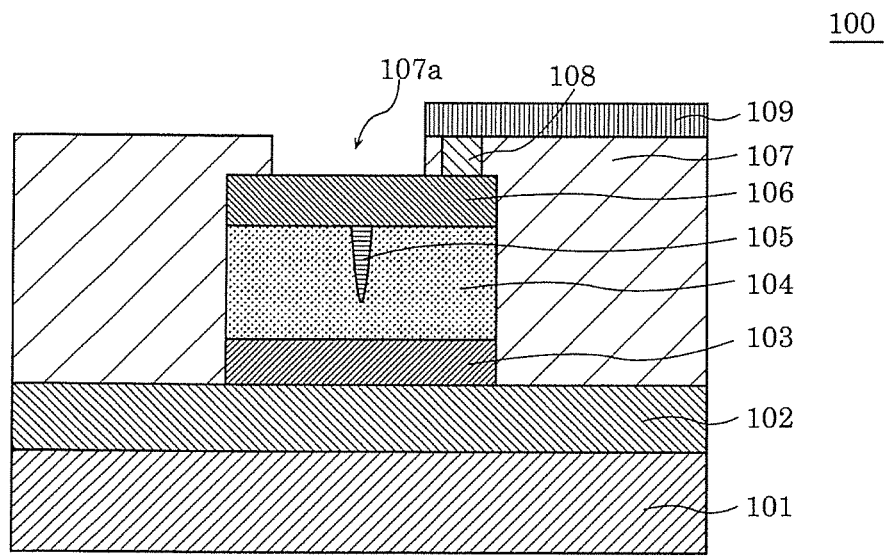
FIG. 1A is a cross-sectional view illustrating an example of a gas sensor according to Embodiment 1.

DESCRIPTION OF EXEMPLARY EMBODIMENTS (Underlying Knowledge Forming Basis of the Present Disclosure)

The inventors of the present disclosure have found the following problems in a conventional gas sensor, as a result of dedicating their works on the study of the conventional gas sensor.

With a conventional gas detection device, even when disturbance such as hydrogen abruptly flowing in or the like occurs, the gas detection device erroneously detects that gas is leaking. This caused a problem such that a gas leak is notified or a device in which the gas detection device is installed is stopped.

In contrast, the gas detection device according to one aspect of the present disclosure is capable of inhibiting error detection of hydrogen-containing gas caused by disturbance, etc. and distinguishing between error detection due to disturbance or the like and detection of a gas leak.

Embodiments of the present disclosure will now be described with reference to the drawings.

In the drawings, like reference signs are assigned to elements presenting substantially identical structures, operations, and effects, and duplicate descriptions are omitted. The numerical values, materials, compositions, shapes, methods of forming films, the connection between elements, etc. described in the following are all mere examples for specifically illustrating the embodiments of the present disclosure, and the present disclosure is not limited to these examples. Among elements in the following embodiments, those not recited in any one of broadest, independent claims are described as optional elements.

Embodiment 1

[Structure of Gas Sensor]

A gas sensor according to Embodiment 1 is a gas sensor having a metal-insulator-metal (MIM) structure in which a resistive film (metal-oxide layer) and metal films are stacked. By utilizing both self-heating and gas sensitivity in a local region formed inside the resistive film, the gas sensor is capable of detecting hydrogen-containing gas without heating with a heater. Here, hydrogen-containing gas is a generic term for gas consisting of molecules including hydrogen atoms, and may contain, for example, hydrogen, methane, alcohol, etc.

FIG. 1A is a cross-sectional view illustrating an example of a structure of gas sensor 100 according to Embodiment 1.

Figure 1B:
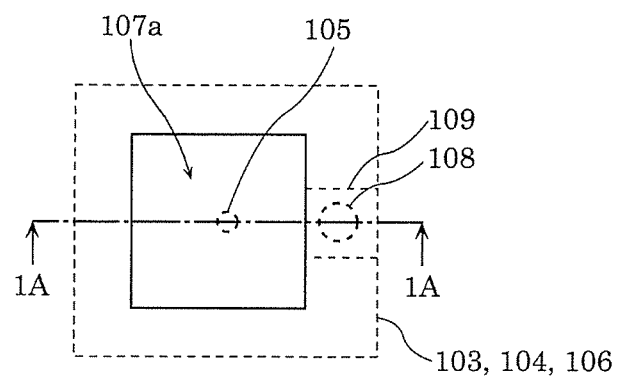
FIG. 1B is a top view illustrating the example of the gas sensor according to Embodiment 1.

FIG. 1B is a top view illustrating the example of the structure of gas sensor 100 according to Embodiment 1. A cross section shown in FIG. 1A corresponds to a cross section taken along the cutting line 1A-1A and viewed in a direction the arrows are pointing in FIG. 1B.

Gas sensor 100 includes substrate 101, insulating film 102 formed on substrate 101, first electrode 103 formed above insulating film 102, second electrode 106, resistive film 104 sandwiched between first electrode 103 and second electrode 106, insulating film 107, via 108, and wiring 109. First electrode 103 and second electrode 106 are disposed such that their main surfaces face each other, and resistive film 104 is disposed in contact with the main surfaces of first electrode 103 and second electrode 106.

Insulating film 107 is provided with opening 107a for allowing second electrode 106 to contact a target gas to be examined. Stated differently, insulating film 107 covers first electrode 103, second electrode 106, and resistive film 104 while at least part of a main surface of second electrode 106 (the other main surface opposite a main surface contacting resistive film 104) is uncovered by insulating film 107, and is thus exposed.

Resistive film 104 lies between first electrode 103 and second electrode 106. A resistance value of resistive film 104 reversibly changes based on an electric signal provided between first electrode 103 and second electrode 106. For example, a resistive state of resistive film 104 reversibly transitions between a high-resistance state and a low-resistance state according to a voltage (potential difference) applied between first electrode 103 and second electrode 106. The resistive state of resistive film 104 transitions, for example, from the high-resistance state to the low-resistance state in response to hydrogen-containing gas brought into contact with second electrode 106.

Resistive film 104 includes, inside, local region 105 that is disposed in contact with second electrode 106 and is not contacting first electrode 103. A degree of oxygen deficiency in local region 105 is higher than that in the surrounding region (i.e., a bulk region in resistive film 104). The degree of oxygen deficiency in local region 105 reversibly changes depending on the application of the electric signal between first electrode 103 and second electrode 106, and also on the presence or absence of hydrogen-containing gas in the gas that second electrode 106 contacts. Local region 105 is a minute region that includes a filament (conductive path) consisting of oxygen defect sites.

Insulating film 107 is provided with via 108 penetrating through insulating film 107 and being connected to second electrode 106, in a portion covering the main surface of second electrode 106. Wiring 109 is disposed on via 108.

In the present disclosure, the "degree of oxygen deficiency" of a metal oxide is a ratio of the amount of oxygen deficient in the metal oxide to the amount of oxygen in an oxide having a stoichiometric composition consisting of the same elements as those of the metal oxide (here, the amount of oxygen deficient is a value obtained by subtracting the amount of oxygen in the metal oxide from the amount of oxygen in the metal oxide having the stoichiometric composition). If a plurality of metal oxides, each of which has a stoichiometric composition consisting of the same elements as those of the metal oxide, is present, the degree of oxygen deficiency of the metal oxide is defined based on one having the highest resistance value among the metal oxides having the stoichiometric composition. A metal oxide having the stoichiometric composition is more stable and has a higher resistance value compared to a metal oxide having a different composition.

For example, when a metal is tantalum (Ta), an oxide having the stoichiometric composition according to the above-described definition is $Ta_2O_5$, and can be expressed as $TaO_{2.5}$. The degree of oxygen deficiency of $TaO_{2.5}$ is 0%, and the degree of oxygen deficiency of $TaO_{1.5}$ results from (2.5−1.5)/2.5 i.e., 40%. In an oxygen-excess metal oxide, the degree of oxygen deficiency is a negative value. In the present disclosure, the degree of oxygen deficiency may be a positive value, zero, or a negative value, unless otherwise specified.

An oxide having a low degree of oxygen deficiency is more similar to an oxide having a stoichiometric composition and therefore has a high resistance value, whereas an oxide having a high degree of oxygen deficiency is more similar to a metal constituting an oxide and therefore has a low resistance value.

The term "oxygen content" is a rate of the number of oxygen atoms based on a total number of atoms. For example, the oxygen content of $Ta_2O_5$ is the rate of the number of oxygen atoms based on the total number of atoms, which is expressed by (O/(Ta+O)), i.e., 71.4 atm %. Accordingly, an oxygen-deficient tantalum oxide has an oxygen content higher than 0 atm % and lower than 71.4 atm %.

Local region 105 is formed in resistive film 104 by applying an initial break voltage between first electrode 103 and second electrode 106. In other words, the initial break voltage is a voltage applied between first electrode 103 and second electrode 106 for forming local region 105. An absolute value of the initial break voltage may be greater than that of a write-in voltage. The write-in voltage is a voltage applied between first electrode 103 and second electrode 106 for causing resistive film 104 to reversibly transition between a high-resistance state and a low-resistance state. Alternatively, the absolute value of the initial break voltage may be less than that of a write-in voltage. In this case, the initial break voltage may be repeatedly or continuously applied for a predetermined period. As illustrated in FIG. 1A, the application of the initial break voltage forms local region 105 being in contact with second electrode 106 and not in contact with first electrode 103.

Local region 105 is conceived to include a filament (conductive path) consisting of oxygen defect sites. Local region 105 has a minute size matching with the filament necessary for a current to flow. The formation of the filament in local region 105 will be described using a percolation model.

The percolation model is based on a theory that a density of oxygen defect sites exceeding a threshold increases the probability of forming a connection of oxygen defect sites in an assumed random distribution of oxygen defect sites in local region 105.

In the percolation model, a filament is formed by connecting a plurality of oxygen defect sites in local region 105. A resistance change in resistive film 104 is caused through the generation and disappearance of the oxygen defect sites in local region 105.

Here, the term "oxygen defect" refers to that oxygen in a metal oxide is deficient compared to that in a metal oxide having a stoichiometric composition, and the term "density of oxygen defect sites" corresponds to the degree of oxygen deficiency. That is, the density of oxygen defect sites increases as the degree of oxygen deficiency becomes higher.

Local region 105 may be formed at only one location in one resistive film 104 of gas sensor 100. The number of local regions 105 formed in resistive film 104 can be determined by, for example, electron beam absorbed current (EBAC) analysis.

In the case where local region 105 is present in resistive film 104, when a voltage is applied between first electrode 103 and second electrode 106, the current flowing in resistive film 104 is concentrated in local region 105.

Local region 105 has a small size and therefore generates heat by, for example, a current of approximately several tens of microamperes flowing at the time of reading a resistance value of gas sensor 100. This heat generation causes a considerable increase in the temperature. The power consumption when a current of approximately several tens of microamperes flows is less than 0.1 mW.

In view of this, second electrode 106 is made of a metal (e.g., Pt) having a catalytic action and local region 105 is in contact with second electrode 106. According to this structure, second electrode 106 is heated by the heat generation in local region 105, and hydrogen atoms are efficiently dissociated from hydrogen-containing gas.

When a target gas to be examined contains hydrogen-containing gas, hydrogen atoms are dissociated from the hydrogen-containing gas at second electrode 106, and the dissociated hydrogen atoms bond with oxygen atoms in local region 105, and as a result, the resistance value of local region 105 decreases.

Gas sensor 100 thus has characteristics of decreasing a resistance value between first electrode 103 and second electrode 106 when hydrogen-containing gas is brought into contact with second electrode 106. When a target gas to be examined is brought into contact with second electrode 106, such characteristics allow the detection of hydrogen-containing gas contained in the gas, by detecting a decrease in the resistance value between first electrode 103 and second electrode 106.

Note that whichever state local region 105 may be in, a high-resistance state or a low-resistance state, a decrease in the resistance value is caused by hydrogen-containing gas brought into contact with second electrode 106. Accordingly, the hydrogen-containing gas can be detected by gas sensor 100 whichever state, high or low, the resistive state of local region 105 may be. Nevertheless, in order to clearly detect a decrease in the resistance value, local region 105 may be electrically set to a high-resistance state prior to the use of gas sensor 100.

The details of gas sensor 100 for obtaining stable resistance change characteristics will now be described.

Resistive film 104 is made of an oxygen-deficient metal oxide. The mother metal of the metal oxide may be selected at least one from among aluminum (Al) and transition metals, such as tantalum (Ta), hafnium (Hf), titanium (Ti), zirconium (Zr), niobium (Nb), tungsten (W), nickel (Ni), and iron (Fe). Since transition metals have multiple oxidation states, it is possible to achieve different resistive states by a redox reaction.

Here, the term "oxygen-deficient metal oxide" refers to a metal oxide having a higher degree of oxygen deficiency compared to a metal oxide having a stoichiometric composition of the same metal elements. An oxygen-deficient metal oxide typically has semiconductor characteristics, whereas the metal oxide having the stoichiometric composition is typically an insulator. Gas sensor 100 having resistive film 104 made of an oxygen-deficient metal oxide can achieve high reproducibility and stable resistance change behavior.

For example, when the metal oxide constituting resistive film 104 is a hafnium oxide represented by $HfO_x$, where x is 1.6 or greater, a resistance value of resistive film 104 can be stably changed. In this case, the hafnium oxide film may have a thickness of 3 nm to 4 nm.

When the metal oxide constituting resistive film 104 is a zirconium oxide represented by $ZrO_x$, where x is 1.4 or greater, the resistance value of resistive film 104 can be stably changed. In this case, the zirconium oxide film may have a thickness of 1 nm to 5 nm.

When the metal oxide constituting resistive film 104 is a tantalum oxide represented by $TaO_x$, where x is 2.1 or greater, the resistance value of resistive film 104 can be stably changed.

The composition of each of the above-mentioned metal-oxide layers can be measured by Rutherford backscattering spectrometry.

The materials for first electrode 103 and second electrode 106 are selected from, for example, among platinum (Pt), iridium (Ir), palladium (Pd), silver (Ag), nickel (Ni), tungsten (W), copper (Cu), aluminum (Al), tantalum (Ta), titanium (Ti), titanium nitride (TiN), tantalum nitride (TaN), titanium aluminum nitride (TiAlN), etc.

Specifically, second electrode 106 is constituted of a material having a catalytic action of dissociating hydrogen atoms from gas molecules including the hydrogen atoms, such as platinum (Pt), iridium (Ir) or palladium (Pd), or an alloy including at least one of these. First electrode 103 may be made of a material including at least one of tungsten (W), nickel (Ni), tantalum (Ta), titan (Ti), aluminum (Al), tantalum nitride (TaN), or titanium nitride (TiN), having a standard electrode potential lower than that of a metal constituting a metal oxide. A material having a higher value of the standard electrode potential is more difficult to be oxidized.

Substrate 101 may be any substrate and is, for example, a silicon single crystal substrate or a semiconductor substrate, but shall not be limited to such. Since resistive film 104 can be formed at a relatively low substrate temperature, resistive film 104 can also be formed, for example, on a resin material.

Gas sensor 100 may further include a load element electrically connected to resistive film 104, such as a fixed resistance, a transistor, or a diode.

Here, resistance change characteristics of gas sensor 100 exhibited due to voltage application will be described based on actual results obtained using a sample device. It should be noted that resistance change characteristics of gas sensor 100 exhibited due to hydrogen-containing gas will be mentioned later.

Figure 2:
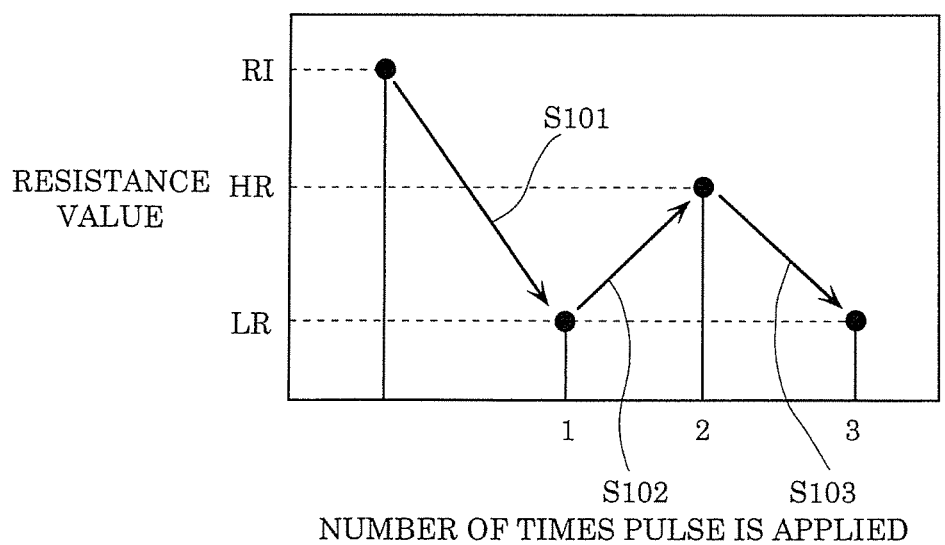
FIG. 2 illustrates an example of a state transition of the gas sensor according to Embodiment 1.

FIG. 2 is a graph showing resistance change characteristics actually measured using the sample device.

In gas sensor 100 as the sample device giving the measurement results shown in FIG. 2, the size of first electrode 103, second electrode 106, and resistive film 104 is defined as 0.5 μm×0.5 μm (area: 0.25 μm²). The value of y in $TaO_y$ representing the composition of a tantalum oxide constituting resistive film 104 is 2.47. Resistive film 104 has a thickness of 5 nm. In such gas sensor 100, when a read-out voltage (e.g., 0.4 V) is applied between first electrode 103 and second electrode 106, initial resistance value RI is approximately $10^7 \Omega$ to $10^8 \Omega$.

As illustrated in FIG. 2, when a resistance value of gas sensor 100 is initial resistance value RI (a value higher than resistance value HR in a high-resistance state), the application of an initial break voltage between first electrode 103 and second electrode 106 changes the resistance value to low resistance value LR (S101). Subsequently, when two different kinds of voltage pulses, i.e., a positive voltage pulse and a negative voltage pulse, having different polarities and each having a pulse width of 100 ns, are alternately applied as a write-in voltage between first electrode 103 and second electrode 106, a resistance value between first electrode 103 and second electrode 106 changes as illustrated in FIG. 2.

That is, when a positive voltage pulse (pulse width: 100 ns) is applied as the write-in voltage between the electrodes, the resistance value between first electrode 103 and second electrode 106 increases from low resistance value LR to high resistance value HR (S102). When a negative voltage pulse (pulse width: 100 ns) is applied as the write-in voltage between the electrodes, the resistance value between first electrode 103 and second electrode 106 decreases from high resistance value HR to low resistance value LR (S103). It should be noted that the polarity of a voltage pulse is "positive" when a potential of second electrode 106 is higher than that of first electrode 103 as a reference, and is "negative" when the potential of second electrode 106 is lower than that of first electrode 103 as a reference.

Figure 3:
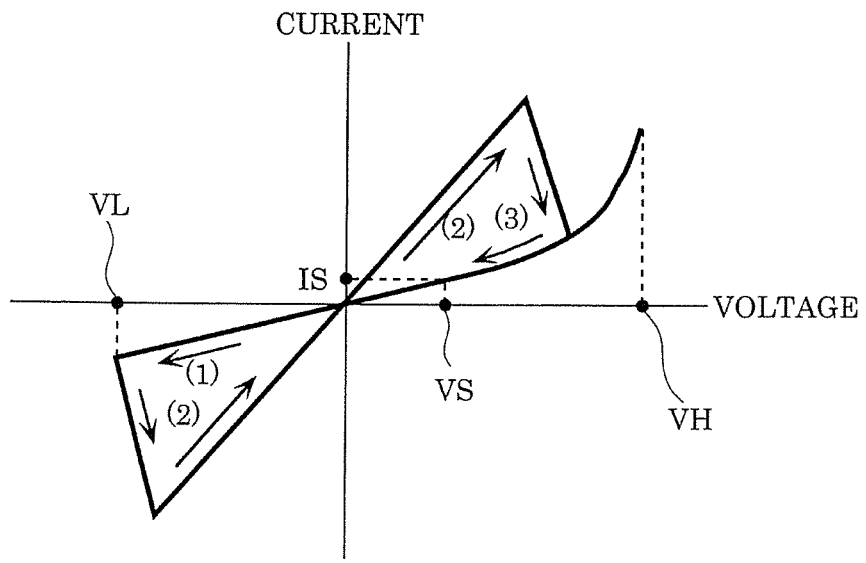
FIG. 3 illustrates an example of current-voltage characteristics of the gas sensor according to Embodiment 1.

FIG. 3 illustrates an example of current-voltage characteristics of gas sensor 100. FIG. 3 illustrates current-voltage characteristics obtained as a result of measuring a current that flows through gas sensor, while a changing voltage is applied between first electrode 103 and second electrode 106 of gas sensor 100. Specifically, gas sensor 100 was previously set to a high-resistance state, and then the applied voltage was changed: (1) firstly from zero to negative write-in voltage VL; (2) subsequently from negative write-in voltage VL to positive write-in voltage VH; and (3) lastly from positive write-in voltage VH to zero. The definitions of "positive" and "negative" in voltage are as described above.

When the applied voltage reaches a negative voltage having a predetermined value, the resistance value between first electrode 103 and second electrode 106 decreases from high resistance value HR to low resistance value LR (the absolute value of current increases). When the applied voltage reaches a positive voltage having a predetermined value, the resistance value between first electrode 103 and second electrode 106 increases from low resistance value LR to high resistance value HR (the absolute value of current decreases).

[Manufacturing Method and Operation of Gas Sensor]

Next, an example of a method of manufacturing gas sensor 100 will be described with reference to FIGS. 4A through 4G.

Figure 4A:
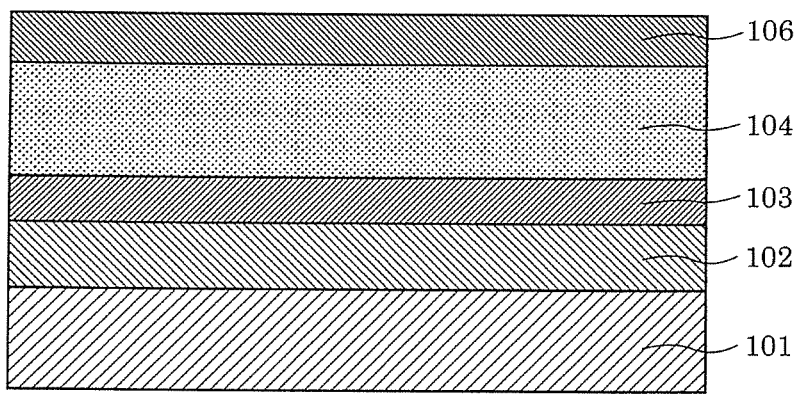
FIG. 4A is a cross-sectional view illustrating an example of a method of manufacturing the gas sensor according to Embodiment 1.

First, as illustrated in FIG. 4A, insulating film 102 having a thickness of 200 nm is formed on substrate 101, for example, of single crystal silicon, using a thermal oxidation method. Subsequently, first electrode 103, e.g., a Pt thin film having a thickness of 100 nm, is formed on insulating film 102 by sputtering. In addition, an adhesion layer of, for example, Ti and TiN may be formed between first electrode 103 and insulating film 102 by sputtering. Subsequently, an oxygen-deficient metal-oxide layer which becomes resistive film 104 is then formed on first electrode 103 by reactive sputtering using, for example, a Ta target. Resistive film 104 is thus formed.

If the thickness of resistive film 104 is too thick, a problem is that an initial resistance value becomes too high, etc., and if the thickness is too thin, it is a problem that a stable resistance change cannot be obtained. For the reasons stated above, the thickness of resistive film 104 may be about 1 nm or more and about 8 nm or less.

Next, second electrode 106, e.g., a Pt thin film having a thickness of 150 nm, is formed on resistive film 104 by sputtering.

Figure 4B:
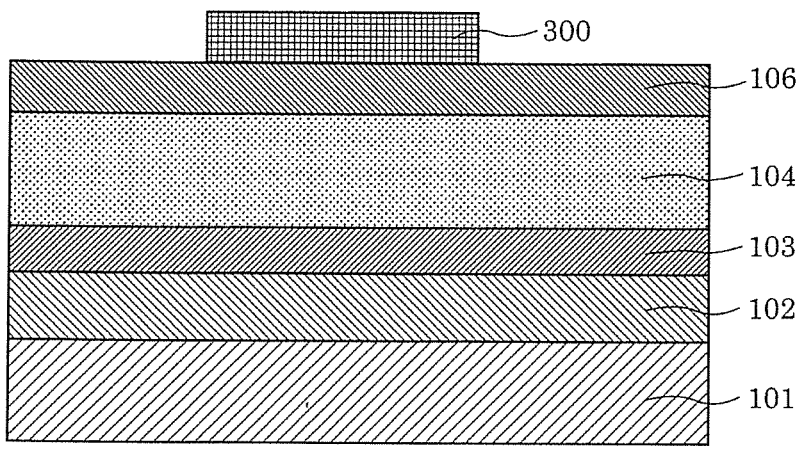
FIG. 4B is a cross-sectional view illustrating the example of the method of manufacturing the gas sensor according to Embodiment 1.
Figure 4C:
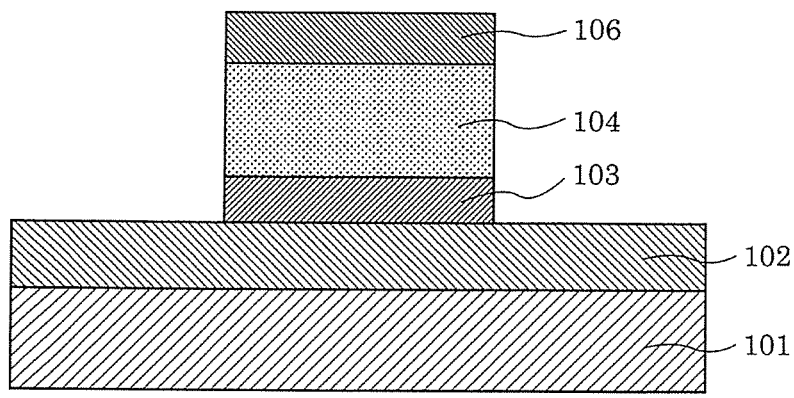
FIG. 4C is a cross-sectional view illustrating the example of the method of manufacturing the gas sensor according to Embodiment 1.

Next, photoresist mask 300 is formed by a photolithography process, as illustrated in FIG. 4B. Subsequently, first electrode 103, resistive film 104, and second electrode 106 are formed into the shape of a device by dry etching using mask 300, as illustrated in FIG. 4C.

Figure 4D:
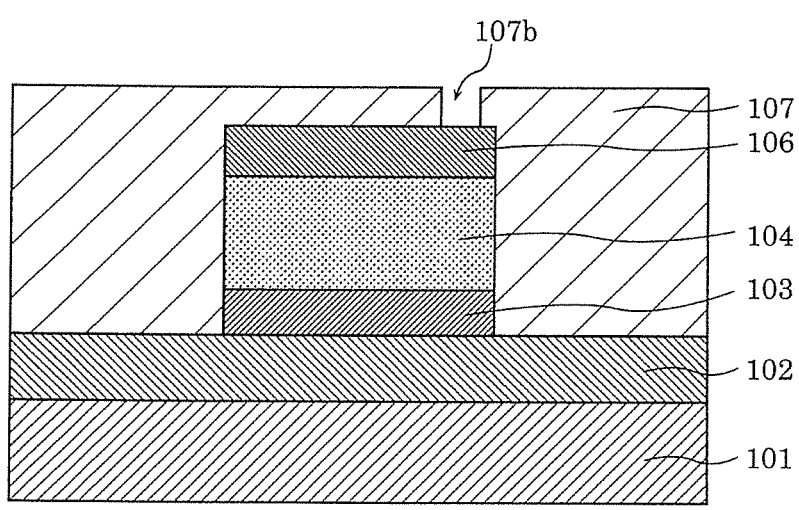
FIG. 4D is a cross-sectional view illustrating the example of the method of manufacturing the gas sensor according to Embodiment 1.

Subsequently, insulating film 107 is formed to cover insulating film 102, first electrode 103, resistive film 104, and second electrode 106, as illustrated in FIG. 4D. Via hole 107b reaching a portion of the main surface of second electrode 106 is then formed by etching insulating film 107.

Figure 4E:
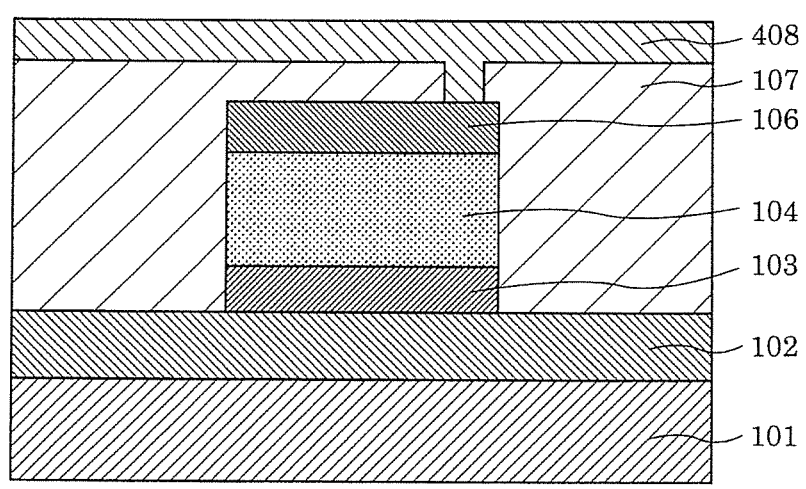
FIG. 4E is a cross-sectional view illustrating the example of the method of manufacturing the gas sensor according to Embodiment 1.
Figure 4F:
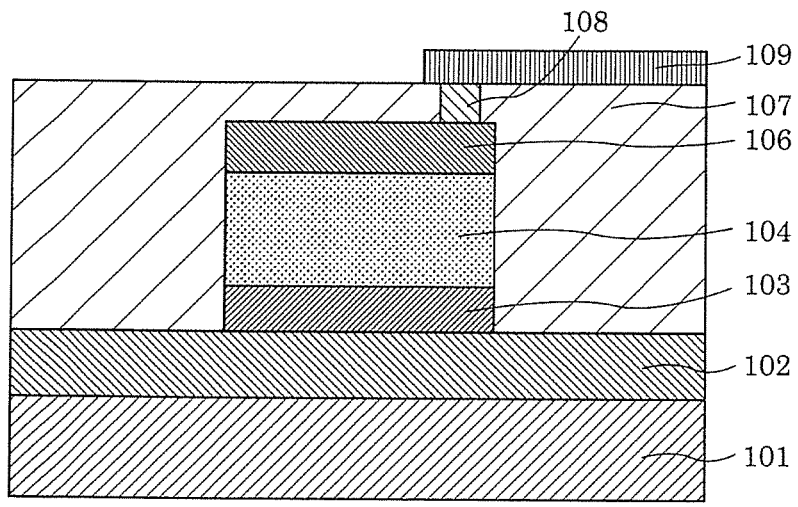
FIG. 4F is a cross-sectional view illustrating the example of the method of manufacturing the gas sensor according to Embodiment 1.

Next, conductive film 408 is formed on the main surface of insulating film 107 and inside of via hole 107b to fill via hole 107b, as illustrated in FIG. 4E. Subsequently, conductive film 408 on insulating film 107 is removed by chemical mechanical polishing (CMP) to form via 108 in via hole 107b, as shown in FIG. 4F. Another conductive film is further formed on insulating film 107 and is patterned to form wiring 109 connected to via 108.

Figure 4G:
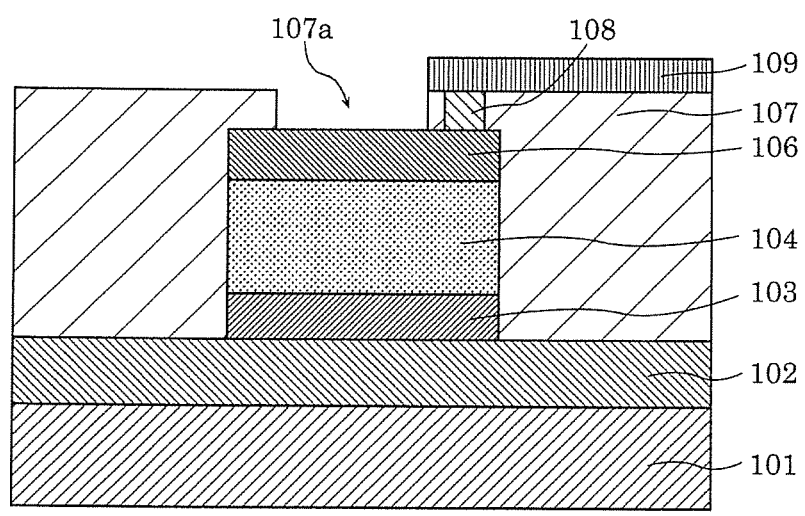
FIG. 4G is a cross-sectional view illustrating the example of the method of manufacturing the gas sensor according to Embodiment 1.

Next, opening 107a that exposes part of the main surface of second electrode 106 by etching insulating film 107, as shown in FIG. 4G.

Subsequently, an initial break voltage is applied between first electrode 103 and second electrode 106 to form local region 105 illustrated in FIG. 1A in resistive film 104. Gas sensor 100 is thus manufactured.

[Variation of Gas Sensor]

Figure 5:
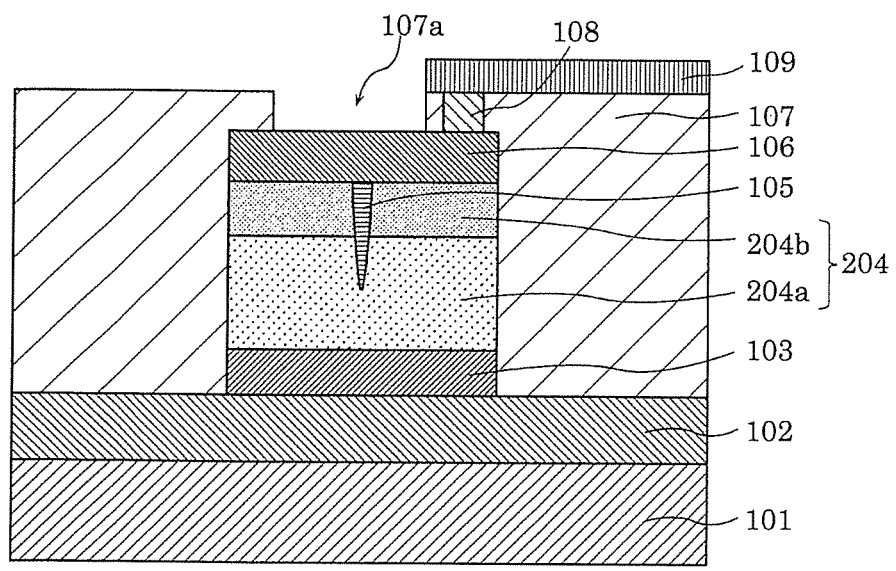
FIG. 5 is a cross-sectional view illustrating a gas sensor according to a variation of Embodiment 1.

FIG. 5 is a cross-sectional view illustrating an example of a structure of a gas sensor according to a variation of Embodiment 1. The following describes the gas sensor according to this variation, focusing only on the points different from gas sensor 100 of Embodiment 1.

Gas sensor 200 of this variation is different from gas sensor 100 of Embodiment 1 in that resistive film 204 includes two layers of first metal-oxide layer 204a that is in contact with first electrode 103 and second metal-oxide layer 204b that is in contact with second electrode 106. Note that resistive film 204 is not limited to a layered product of two metal-oxide layers and may be a layered product of three or more metal-oxide layers.

First metal-oxide layer 204a and second metal-oxide layer 204b include local region 105 in which a degree of oxygen deficiency reversibly changes depending on the application of an electrical pulse and in response to hydrogen-containing gas. Local region 105 penetrates at least through second metal-oxide layer 204b to be in contact with second electrode 106.

Stated differently, resistive film 204 has at least a layered structure composed of first metal-oxide layer 204a including a first metal oxide and second metal-oxide layer 204b including a second metal oxide. First metal-oxide layer 204a is disposed between first electrode 103 and second metal-oxide layer 204b, and second metal-oxide layer 204b is disposed between first metal-oxide layer 204a and second electrode 106.

Second metal-oxide layer 204b may have a thickness less than that of first metal-oxide layer 204a. In this case, a structure including local region 105 that is not in contact with first electrode 103 can be readily formed. A degree of oxygen deficiency of second metal-oxide layer 204b may be lower than that of first metal-oxide layer 204a. In this case, a resistance value of second metal-oxide layer 204b is higher than that of first metal-oxide layer 204a. Accordingly, most of the voltage applied to resistive film 204 is applied to second metal-oxide layer 204b. This structure is advantageous, for example, for concentrating an initial break voltage in second metal-oxide layer 204b and reducing an initial break voltage necessary for forming local region 105.

In the present disclosure, when a metal constituting first metal-oxide layer 204a is the same as that constituting second metal-oxide layer 204b, the term "degree of oxygen content" may be used instead of the term "oxygen deficiency". "High oxygen content" corresponds to "low degree of oxygen deficiency" and "low oxygen content" corresponds to "high degree of oxygen deficiency".

However, as described below, resistive film 204 according to this embodiment is not limited to the case where the metal constituting first metal-oxide layer 204a is the same as that constituting second metal-oxide layer 204b, and the metals may be different from each other. That is, first metal-oxide layer 204a and second metal-oxide layer 204b may be made of different metal oxides.

When the first metal constituting first metal-oxide layer 204a and the second metal constituting second metal-oxide layer 204b are the same, an oxygen content has a corresponding relationship with a degree of oxygen deficiency. That is, when the oxygen content of the second metal oxide is higher than that of the first metal oxide, the second metal oxide has a degree of oxygen deficiency lower than that of the first metal oxide.

Resistive film 204 includes local region 105 in the vicinity of an interface between first metal-oxide layer 204a and second metal-oxide layer 204b. Local region 105 has a degree of oxygen deficiency higher than that of second metal-oxide layer 204b, and is different from that of first metal-oxide layer 204a.

Local region 105 is formed in resistive film 204 by the application of an initial break voltage between first electrode 103 and second electrode 106. The initial break voltage forms local region 105 that is in contact with second electrode 106, penetrates through second metal-oxide layer 204b, partially penetrates into first metal-oxide layer 204a, and is not in contact with first electrode 103.

One example of an evaluation on the resistance change characteristics, of thus-structured gas sensor 200, which exhibit in response to hydrogen-containing gas will be described.

Figure 6:
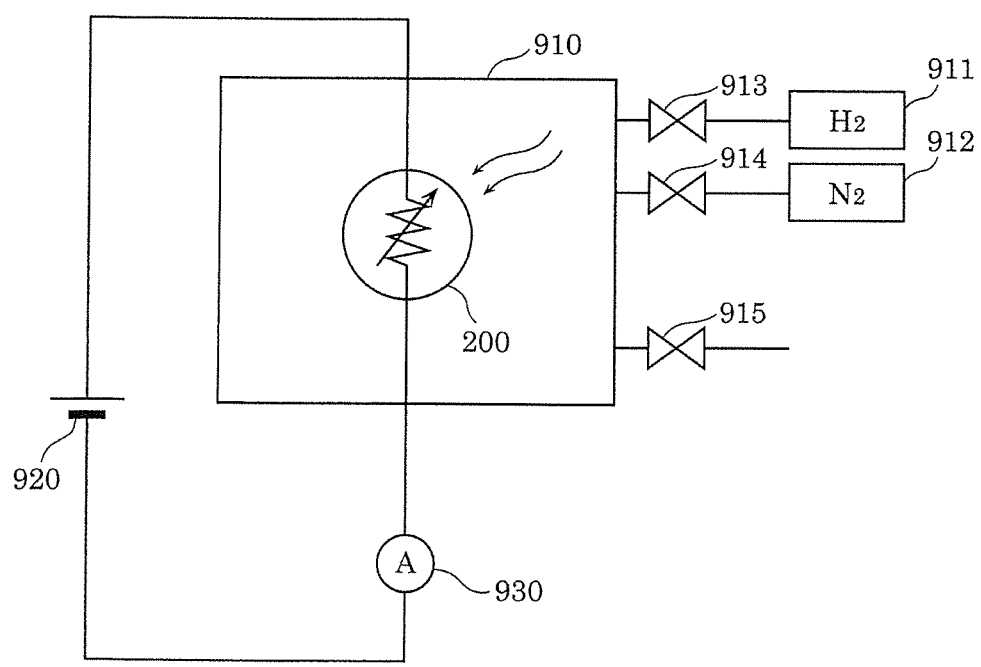
FIG. 6 illustrates a system for evaluating the gas sensor according to the variation of Embodiment 1.

FIG. 6 is a block diagram illustrating an example of an evaluation system used for evaluating gas sensor 200. Evaluation system 900 illustrated in FIG. 6 includes airtight container 910 accommodating gas sensor 200, detection power source 920 that generates a detection voltage, and current meter 930. Airtight container 910 is connected to hydrogen cylinder 911 and nitrogen cylinder 912 through introduction valves 913 and 914, respectively, and gas inside airtight container 910 can be exhausted through exhaust valve 915.

Figure 7:
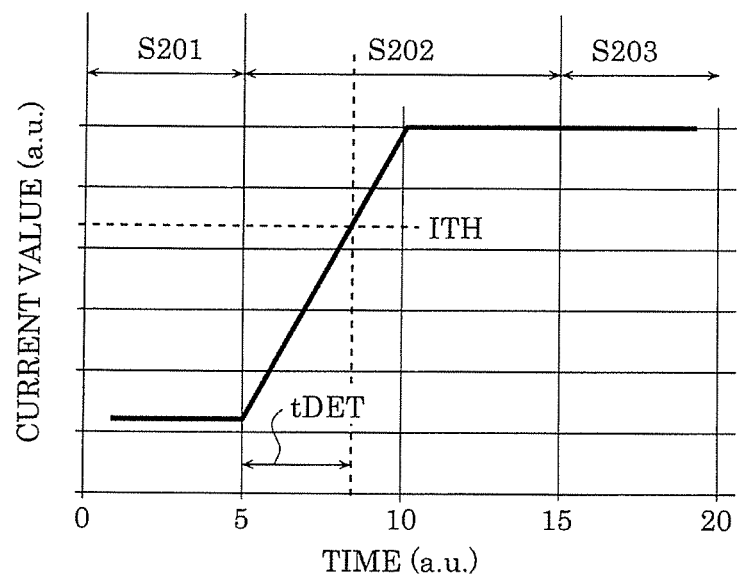
FIG. 7 illustrates a result of an evaluation on the gas sensor according to the variation of Embodiment 1.

FIG. 7 is a graph illustrating one example of an evaluation on gas sensor 200. The horizontal axis indicates time (a.u.) while the vertical axis indicates the value of a current (a.u.) flowing through gas sensor 200. In the experiment, nitrogen gas was introduced into airtight container 910 accommodating gas sensor 200, and a detection voltage was applied to start measurement of the current. Subsequently, hydrogen gas was introduced into airtight container 910, and after a predetermined period of time, the introduction gas was changed from hydrogen gas to nitrogen gas.

FIG. 7 shows a result of the experiment. The horizontal axis indicates three periods: the former process of nitrogen introduction (Step S201); the introduction of hydrogen (Step S202); and the latter process of nitrogen introduction (Step S203). The current value started to increase after the change of the introduction gas from nitrogen gas to hydrogen gas, and since the current value reaches a predetermined threshold current ITH, hydrogen gas is detected. The time from when the current value increases after the start of the introduction of hydrogen gas until when the current value reaches the predetermined threshold current is presented as hydrogen detection time tDET. After the detection of hydrogen, the current value increases even more and then saturates.

After the detection of the hydrogen gas, the current value remained saturated even after the introduction gas was changed from hydrogen gas to nitrogen gas, and did not decrease again. In other words, it is observable that gas sensor 200 has such characteristics that a resistance value between first electrode 103 and second electrode 106 decreases when gas (hydrogen gas in this case) containing hydrogen molecules including hydrogen atoms is brought into contact with second electrode 106, and the state in which the resistance value stays low is maintained even when gas (nitrogen gas in this case) not including hydrogen atoms is brought into contact with second electrode 106 after the decrease.

In this evaluation example, a predetermined voltage (reset voltage) was applied between first electrode 103 and second electrode 106 to set local region 105 to a high-resistance state prior to the use of gas sensor 200.

In the operation of monitoring for hydrogen-containing gas, a detection voltage of 0.6 V was applied between first electrode 103 and second electrode 106, hydrogen gas was detected, and in the state where the current value saturated, a current of approximately 20 µA flowed between first electrode 103 and second electrode 106.

It is therefore demonstrated that gas sensor 200 is capable of monitoring for hydrogen-containing gas with a very low power consumption of 0.012 mW at the highest. The voltage of 0.6 V may be applied at all times between first electrode 103 and second electrode 106.

When a detection voltage of 0.4 V was applied between first electrode 103 and second electrode 106, a resistance change did not occur in response to hydrogen gas, and thereby, hydrogen gas was not detected. This was probably caused because the amount of heat generated in local region 105 by the application of the detection voltage of 0.4 V was not sufficient to accelerate the catalytic action of second electrode 106. It is inferred that the application of a detection voltage of 0.6 V was necessary to detect hydrogen gas.

The detection voltage of 0.6 V in this case is one example of a detection voltage that activates the characteristic such that when second electrode 106 comes into contact with gas containing gas molecules including hydrogen atoms, a resistance value between first electrode 103 and second electrode 106 decreases.

The detection voltage here is read-out voltage VS illustrated in FIG. 3. It is necessary to prevent a resistance value of gas sensor 200 from changing due to a cause other than hydrogen atoms. As illustrated in FIG. 3, when a positive voltage having a predetermined value is applied to gas sensor 200, the resistance value of gas sensor 200 changes from low to high resistance, whereas when a negative voltage having a predetermined value is applied to gas sensor 200, the resistance value of gas sensor 200 changes from high to low resistance. This is why an absolute value of a detection voltage (read-out voltage VS) has to be set to a value less than a predetermined value so as not to cause a change in the resistance value of gas sensor 200.

After gas sensor 200 detects hydrogen gas and the current value increases and then saturates, the current value does not decrease again even the concentration of hydrogen gas decreases. Therefore, in order to change the state of gas sensor 200 back to a high-resistance state which is a state before the detection of hydrogen gas, a positive voltage (reset voltage) having a predetermined value needs to be applied again between first electrode 103 and second electrode 106.

Based on the results described above, the inventors presume a mechanism of detecting hydrogen-containing gas by gas sensor 200 as follows.

When hydrogen-containing gas is brought into contact with second electrode 106, hydrogen atoms are dissociated from the hydrogen-containing gas by the catalytic action of second electrode 106. The dissociated hydrogen atoms diffuse in second electrode 106 for maintaining the equilibrium state, and reach local region 105.

The hydrogen atoms that have reached local region 105 cause a reduction reaction in minute local region 105, and thus, oxygen in local region 105 and the hydrogen atoms react with each other. Oxygen deficiency newly occurs in local region 105 and the degree of oxygen deficiency in local region 105 increases. Oxygen deficiency occurs in many places in local region 105; as a result, filaments formed from such oxygen deficiencies are readily connected to one another to reduce a resistance value of local region 105. As a result, the current flowing between first electrode 103 and second electrode 106 increases.

It is inferable that the above-described behavior is not limited to gas sensor 200 and also exhibits in gas sensor 100 or any other gas sensor having substantially the same structures of the main sections as those of the main sections of gas sensor 200. It is also inferable that detectable gas is not limited to hydrogen gas, and the above-described behavior also exhibits in detecting various kinds of hydrogen-containing gas such as methane or alcohol.

As described above, according to the gas sensor of this embodiment, it is possible to attain a gas sensor highly capable of saving power which generates heat only with a current for detecting the resistive state of the gas sensor, and is capable of detecting hydrogen-containing gas without heating with a separate heater.

In addition, when gas containing gas molecules including hydrogen atoms is brought into contact with the second electrode, a resistance value between the first electrode and the second electrode decreases, and even when gas not including hydrogen atoms is brought into contact with the second electrode after the decrease, it is possible to maintain the state in which the resistance value stays low.

[Gas Detection Circuit]

Figure 8A:
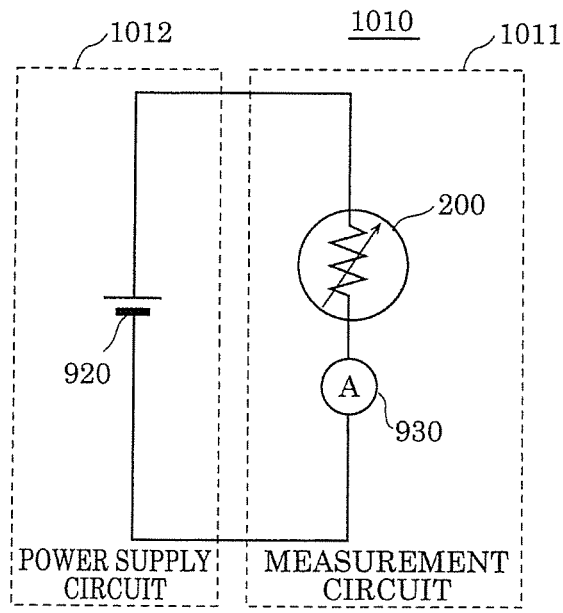
FIG. 8A is a circuit diagram illustrating an example of a gas detection device according to Embodiment 1.

FIG. 8A is a circuit diagram illustrating an example of gas detection device 1010 including gas sensor 200 according to the variation of Embodiment 1.

Gas detection device 1010 includes measurement circuit 1011 formed by connecting gas sensor 200 and current meter 930 in series, and power supply circuit 1012 including detection power source 920.

More specifically, second electrode 106 of gas sensor 200 is connected to a positive potential terminal of detection power source 920 via via 108 and wiring 109 illustrated in FIG. 5. First electrode 103 of gas sensor 200 is connected to one end of current meter 930 via, for example, a wiring (not shown in the diagram) or the like. The other end of current meter 930 is connected to a negative potential terminal of detection power source 920. According to the above-described structure, a predetermined voltage is applied between first electrode 103 and second electrode 106 of gas sensor 200, by detection power source 920.

In gas detection device 1010, a time point at which a current value measured by current meter 930 connected to gas sensor 200 exceeds predetermined threshold current ITH illustrated in FIG. 7 is a point of determination for hydrogen detection. That is, gas detection device 1010 determines that hydrogen-containing gas is detected at the time point when the current flowing through gas sensor 200 exceeds predetermined threshold current ITH.

As described above, with the gas sensor of the present embodiment, it is possible to detect hydrogen with less power. Note that although the present embodiment has described the result of the experiment in the case of detecting hydrogen gas, it is observed that the same effects can be achieved in the case of detecting hydrogen-containing gas (e.g., ammonia gas).

The above has illustrated an example of detecting hydrogen, and the gas sensor of this embodiment not only detects hydrogen but also has the characteristics of maintaining the state in which hydrogen is detected (a high-resistance state is maintained even when hydrogen concentration decreases). Accordingly, it is also effective to provide, in a hydrogen plant or the like, a plurality of the gas sensors according to the present embodiment as hydrogen leak storage elements for examining whether there have been hydrogen leaks in the past.

[Gas Detection Device Having a Reset Function]

Figure 8B:
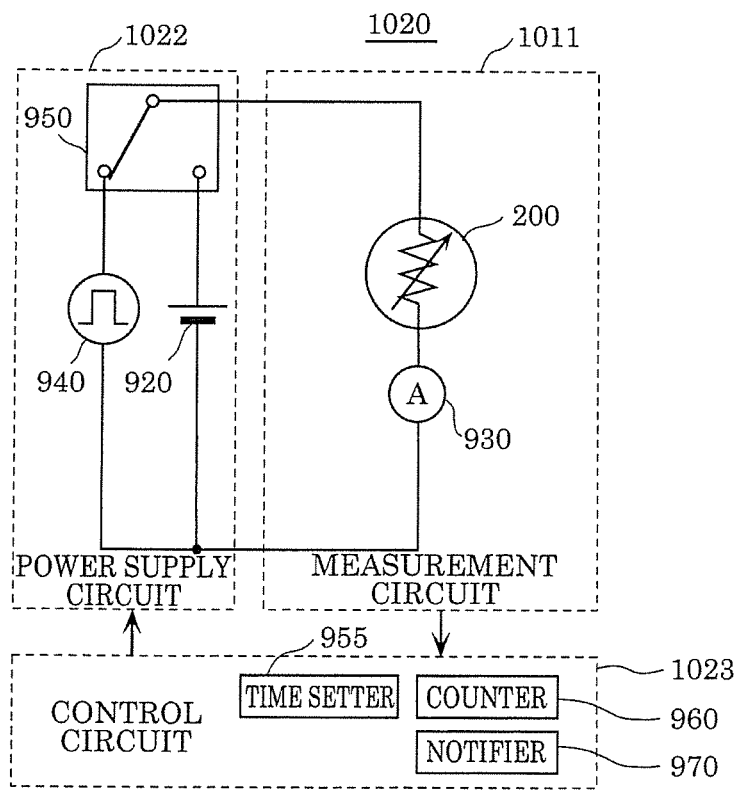
FIG. 8B is a circuit diagram illustrating an example of the gas detection device according to Embodiment 1.
Figure 9:
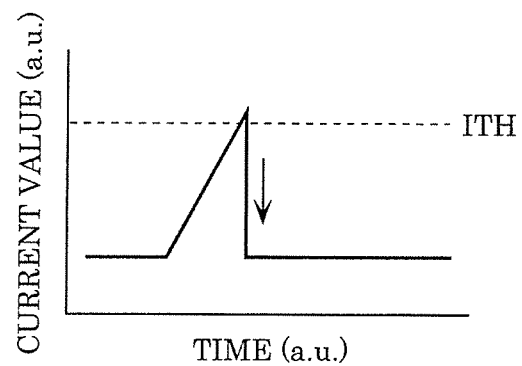
FIG. 9 illustrates a current flowing through gas sensor 200 before and after a reset operation performed by the gas detection device according to Embodiment 1.

FIG. 8B is a circuit diagram illustrating an example of a gas detection device capable of resetting gas sensor 200 from a low-resistance state to a high-resistance state. FIG. 9 illustrates a current flowing through gas sensor 200 before and after a reset operation.

To configure gas detection device 1020 in FIG. 8B, power supply circuit 1012 in gas detection device 1010 illustrated in FIG. 8A is changed to power supply circuit 1022 in which switch 950 and reset power source 940 are added to detection power source 920. Gas detection device 1020 further includes control circuit 1023.

In power supply circuit 1022, reset power source 940 is a power source for electrically resetting, to a high-resistance state, gas sensor 200 that has been in a low-resistance state due to hydrogen-containing gas, by applying a reset voltage (e.g., 1.5 V) having a predetermined value to gas sensor 200. Note that in the present disclosure, a reset voltage is equivalent to the first voltage.

Switch 950 is a switch that switches between: a connection between gas sensor 200 and detection power source 920; and a connection between gas sensor 200 and reset power source 940.

Control circuit 1023 is connected to measurement circuit 1011 and power supply circuit 1022. In this embodiment, control circuit 1023 is a determiner that determines whether a leak of hydrogen-containing gas is present.

When hydrogen-containing gas is detected in measurement circuit 1011, control circuit 1023 causes switch 950 provided in power supply circuit 1022 to switch and also causes gas sensor 200 that has been connected to detection power source 920 to be connected to reset power source 940. With this, a reset voltage is applied to gas sensor 200 and gas sensor 200 is thus reset from a low-resistance state to a high-resistance state. After gas sensor 200 has been reset, control circuit 1023 causes gas sensor 200 to be connected again to detection power source 920. With this, gas sensor 200 becomes capable of detecting hydrogen-containing gas again.

Control circuit 1023 also includes time setter 955, counter 960, and notifier 970.

Time setter 955 is a timer that sets a waiting time after gas sensor 200 has been reset until a time when the next reset is performed. Time setter 955 has a time measuring function, and for example, starts measuring time when gas sensor 200 is reset for the first time and stops measuring time when a predetermined period has elapsed.

Counter 960 is a reset counter that counts the number of times gas sensor 200 is reset, as will be mentioned later. Note that the number of times gas sensor 200 is reset, which is counted by counter 960, is referred to as reset count R.

Notifier 970 is a notifier for notifying the user of an anomaly that hydrogen-containing gas is leaking, when gas sensor 200 detects hydrogen-containing gas. Notifier 970 is, for example, an audio outputting device that notifies the user of an anomaly by sounds or an image outputting device that notifies the user of an anomaly by an image.

Note that in FIG. 8B, reset power source 940 is one example of "the first power supply circuit" and detection power source 920 is one example of "the second power supply circuit" in the present disclosure. In the present disclosure, "power supply circuit" may be, for example, a power source itself or a conversion circuit that converts a voltage from an external power source into a desired voltage.

Gas detection device 1020 detects hydrogen-containing gas using gas sensor 200 and current meter 930. Here, when gas detection device 1020 detects hydrogen-containing gas, that is, at the time point when the current flowing through gas sensor 200 exceeds predetermined threshold current ITH, as illustrated in FIG. 9, control circuit 1023 causes switch 950 to be connected to reset power source 940. With the application of a reset voltage (e.g., 1.5 V) to gas sensor 200 by reset power source 940, gas sensor 200 that has been in a low-resistance state is reset to a high-resistance state. With this, the current flowing through gas sensor 200 is reset to a value that is before the detection of hydrogen and is the threshold or lower.

Thus, by resetting gas sensor 200, which has been in a low-resistance state after the detection of hydrogen-containing gas, to a high-resistance state, gas sensor 200 becomes capable of repeatedly detecting hydrogen-containing gas.

It should be noted that the effects achieved with the aforementioned gas detection devices 1010 and 1020 can be achieved not only in the case of using gas sensor 200 but also in the case of using gas sensor 100 or any other gas sensor having substantially the same structures of the main sections as those of the main sections of gas sensor 200.

The timing at which a reset voltage is applied between the first electrode and the second electrode to reset the gas sensor to a high-resistance state is not limited to timing after the detection of hydrogen-containing gas. For example, the gas sensor may be reset before the detection of hydrogen-containing gas (particularly before the first detection). Thus, by detecting hydrogen-containing gas using a gas sensor whose resistive state is a high-resistance state, it is possible to more clearly detect a decrease in a resistance value between the electrodes. This therefore enhances the gas sensor's capability of detecting hydrogen-containing gas.

Here, a current flowing through gas sensor 200 exceeds threshold current ITH, in some cases, due to disturbance such as hydrogen-containing gas abruptly flowing in or the like. When the current flowing through gas sensor 200 exceeds threshold current ITH due to such disturbance, the current neither increases again nor exceeds threshold current ITH after gas sensor 200 has been reset. However, when hydrogen-containing gas is actually leaking and is not the case of disturbance, a phenomenon such that the current increases again and exceeds threshold current ITH occurs repeatedly after gas sensor 200 has been reset.

In view of this, in order to distinguish between error detection due to disturbance or the like and detection of a leak of hydrogen-containing gas, a gas detection method is used for determining that a leak of hydrogen-containing gas is present, depending on a state in which a reset is performed after a reset is performed for the first time, as described below. The state in which a reset is performed after a reset is performed for the first time is referred to as, for example, a time period until the next reset is performed after the first reset, the number of times a reset is performed after the first reset, or the like.

[Gas Detection Method]

Figure 10:
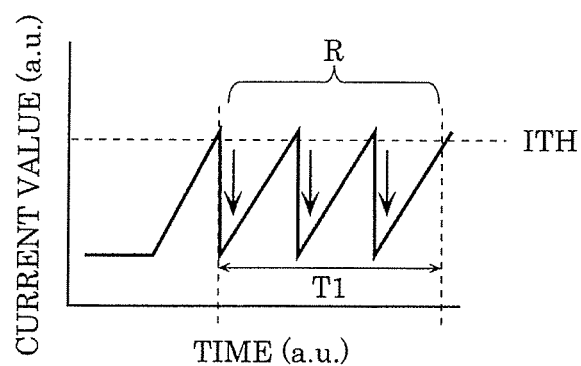
FIG. 10 is a diagram for explaining a gas detection method according to Embodiment 1.

FIG. 10 is a diagram for explaining a gas detection method according to this embodiment.

Gas detection device 1020 according to this embodiment determines that a leak of hydrogen-containing gas is present, when a reset is performed for predetermined N number of times or more within a predetermined period after a reset is performed for the first time in control circuit 1023.

In other words, counter 960 in control circuit 1023 counts the number of times R gas sensor 200 is reset (reset count R) after the first reset is performed, and determines whether reset count R indicates predetermined number N or greater within predetermined period T1.

Figure 11:
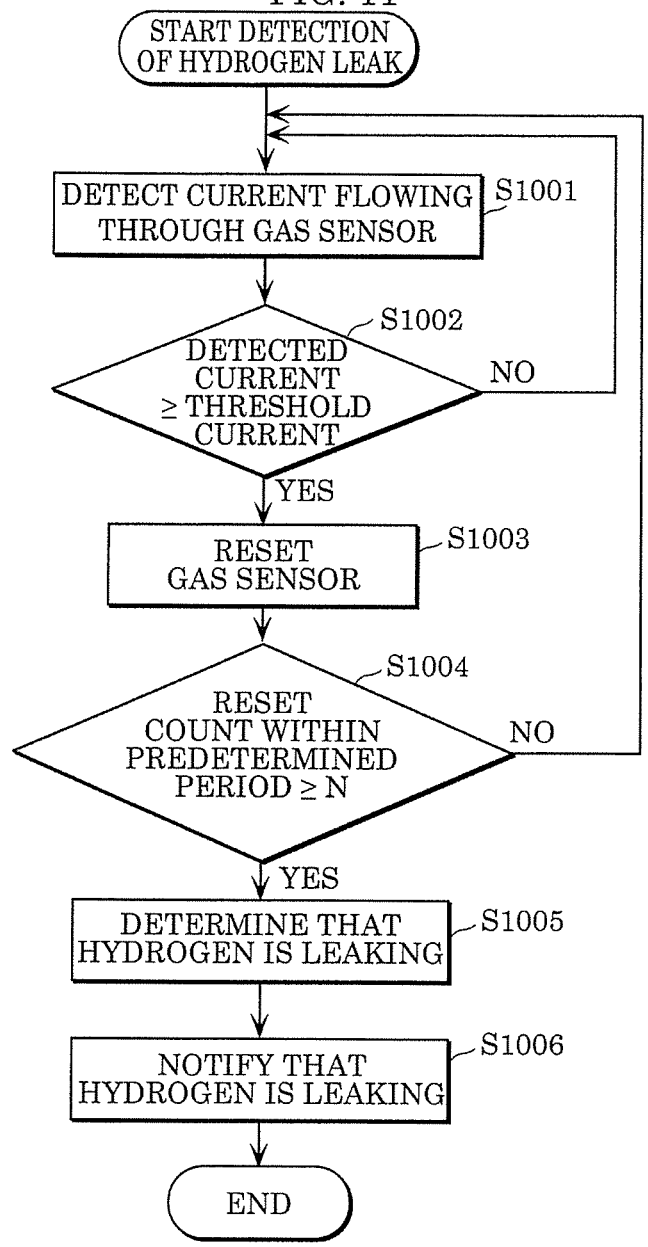
FIG. 11 is a flowchart illustrating an example of the gas detection method according to Embodiment 1.

FIG. 11 is a flowchart illustrating an example of the gas detection method according to this embodiment. As illustrated in FIG. 11, current meter 930 detects a current flowing through gas sensor 200 (Step S1001). Subsequently, whether the current that has been detected (detected current) is threshold current ITH or greater is determined in control circuit 1023 (Step S1002).

When the detected current is threshold current ITH or greater (YES in Step S1002), control circuit 1023 causes switch 950 to be connected to reset power source 940, as described above. With this, a reset voltage is applied from reset power source 940 to gas sensor 200, and gas sensor 200 is thus reset (Step SS1003). The reset at this time is referred to as the first reset. At this time, time setter 955 in control circuit 1023 starts measuring an elapsed time after gas sensor 200 has been reset.

The number of times R gas sensor 200 is reset (reset count R) is counted by counter 960 in control circuit 1023. Control circuit 1023 then determines whether reset count R within predetermined period T1 indicates predetermined number N or greater (Step S1004). In other words, time setter 955 determines whether reset count R indicates predetermined number N or greater, when the elapsed time measured by time setter 955 equals to T1. Predetermined number N here is 1 or greater and may be, for example, 3 as illustrated in FIG. 10 or any other number. Predetermined period T1 is, for example, one minute.

When reset count R within predetermined period T1 indicates N or greater (YES in Step S1004), control circuit 1023 determines that hydrogen-containing gas is leaking (Step S1005). Subsequently, notifier 970 in control circuit 1023 notifies of a leak of hydrogen-containing gas (hydrogen leak) (Step S1006). Note that in addition to the notification of hydrogen leak, control circuit 1023 may perform control to stop the operation of a device (e.g., a fuel cell vehicle to be mentioned later) in which gas detection device 1020 is installed.

When reset count R within predetermined period T1 is less than N (NO in Step S1004), control circuit 1023 causes switch 950 to be connected to detection power source 920. With this, gas sensor 200 becomes capable of detecting hydrogen-containing gas again, and detects hydrogen-containing gas again. At this time, time setter 955 may stop measuring time.

When the detected current is less than threshold current ITH (NO in Step S1002), control circuit 1023 causes switch 950 to be connected to detection power source 920, as described above. With this, gas sensor 200 is in a state capable of detecting hydrogen-containing gas again, and detects hydrogen-containing gas again. At this time, time setter 955 may stop measuring time.

Thus, when a reset is performed for a predetermined number of N times or more within predetermined period T1 after a reset is performed for the first time, in gas sensor 200, control circuit 1023 determines that hydrogen-containing gas is leaking. Accordingly, gas detection device 1020 is capable of distinguishing between error detection due to disturbance or the like and detection of a leak of hydrogen-containing gas, and notifying of a hydrogen leak only when a leak of hydrogen-containing gas is detected.

Embodiment 2

Figure 12:
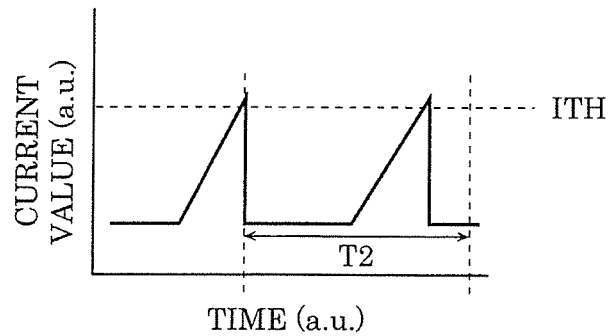
FIG. 12 is a diagram for explaining a gas detection method according to Embodiment 2.

Next, Embodiment 2 will be described. FIG. 12 is a diagram for explaining a gas detection method according to this embodiment.

The gas detection method according to Embodiment 2 is different from the gas detection method according to Embodiment 1 in that when gas sensor 200 is reset again within a predetermined period after the first reset, gas sensor 200 determines that hydrogen-containing gas is leaking.

In other words, when a detected current is again predetermined threshold current ITH or greater within predetermined period T2 after a reset has been performed for the first time, in counter 960 in control circuit 1023, and gas sensor 200 performs again the reset operation, as illustrated in FIG. 12, gas sensor 200 determines that hydrogen-containing gas is leaking.

Figure 13:
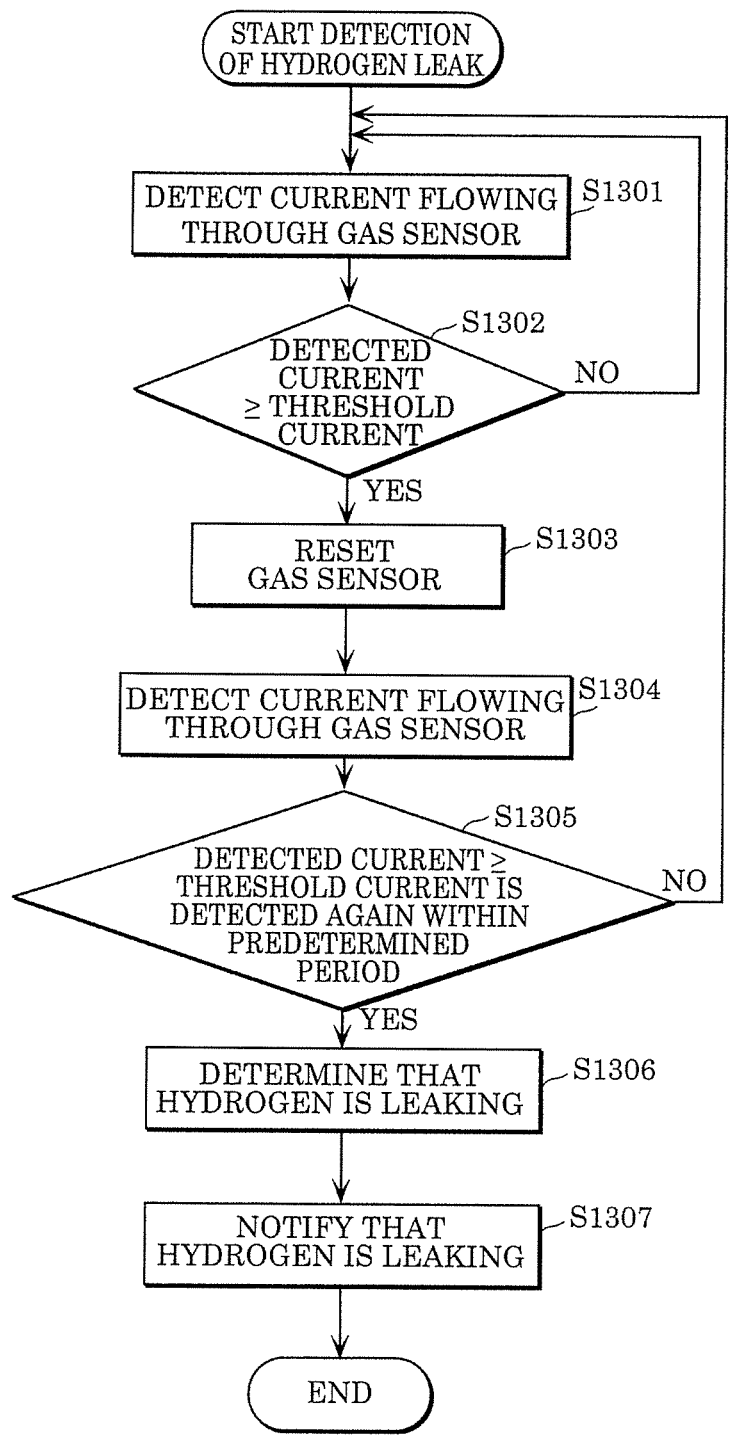
FIG. 13 is a flowchart illustrating an example of the gas detection method according to Embodiment 2.

FIG. 13 is a flowchart illustrating an example of the gas detection method according to this embodiment. As illustrated in FIG. 13, current meter 930 detects a current flowing through gas sensor 200 (Step S1301), as in the gas detection method described in Embodiment 1. Subsequently, whether the current that has been detected (detected current) is threshold current ITH or greater is determined in control circuit 1023 (Step S1302).

When the detected current is threshold current ITH or greater (YES in Step S1302), control circuit 1023 causes switch 950 to be connected to reset power source 940, as described above, and causes gas sensor 200 to be reset (Step S1303). The reset at this time is referred to as the first reset. Here, control circuit 1023 sets, by time setter 955, predetermined period T2 as a waiting time until the next reset is performed. It should be noted that predetermined period T2 is, for example, one minute. It should be also noted that the shorter predetermined period T2 is, with better sensitivity gas sensor 200 is capable of detecting a leak of hydrogen-containing gas.

Subsequently, control circuit 1023 causes switch 950 to be connected to detection power source 920, and gas sensor 200 detects hydrogen-containing gas again. At this time, time setter 955 starts measuring time and measures an elapsed time after gas sensor 200 has been reset.

Subsequently, control circuit 1023 determines whether the detected current is again threshold current ITH or greater within predetermined period T2 that is set as a waiting time after gas sensor 200 has been reset, and gas sensor 200 is to be reset (Step S1305). In other words, control circuit 1023 determines whether gas sensor 200 is to be reset again, before the time measured by time setter 955 elapses over T2. When gas sensor 200 is reset again within predetermined period T2 (YES in Step S1305), control circuit 1023 determines that hydrogen-containing gas is leaking (Step S1306). Subsequently, notifier 970 in control circuit 1023 notifies that hydrogen-containing gas is leaking (Step S1307). Here, control circuit 1023 may perform control to stop the operation of a device, on which gas detection device 1020 is mounted.

When the detected current within predetermined period T2 is less than threshold current ITH (NO in Step S1305), control circuit 1023 causes switch 950 to be connected to detection power source 920. With this, gas sensor 200 detects hydrogen-containing gas again. At this time, time setter 955 may stop measuring time.

When the detected current is less than threshold current ITH (NO in Step S1302), control circuit 1023 causes switch 950 to be connected to detection power source 920, as described above. With this, gas sensor 200 detects hydrogen-containing gas again. At this time, time setter 955 may stop measuring time.

Thus, when the detected current is again threshold current ITH or greater within predetermined period T2 after gas sensor 200 has been reset for the first time, and gas sensor 200 is thus reset again, gas detection device 1020 determines that a hydrogen leak is detected. Accordingly, gas detection device 1020 is capable of distinguishing between error detection due to disturbance or the like and detection of a leak of hydrogen gas leak, and notifying of a hydrogen leak only when a leak of hydrogen-containing gas is detected. By setting the number of times a reset is performed after the first reset, depending on an environment and conditions in which a gas detection device is used, it is possible to properly detect a leak of hydrogen-containing gas depending on the environment and the conditions.

Embodiment 3

Figure 14:
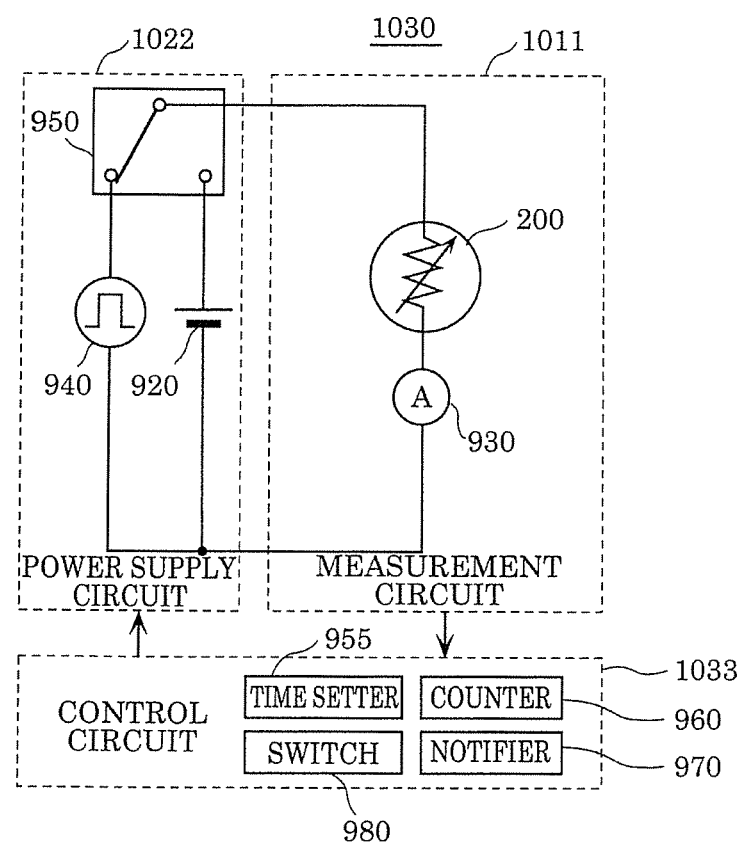
FIG. 14 is a circuit diagram illustrating an example of a gas detection device according to Embodiment 3.

Next, Embodiment 3 will be described. FIG. 14 is a diagram for explaining a gas detection device according to this embodiment.

Gas detection device 1030 according to this embodiment is different from gas detection device 1020 according to Embodiment 1 in that control circuit 1033 includes switch 980.

As illustrated in FIG. 14, gas detection device 1030 includes measurement circuit 1011, power supply circuit 1022, and control circuit 1023. The configurations of measurement circuit 1011 and power supply circuit 1022 are the same as those of measurement 1011 and power supply circuit 1022 described in Embodiment 1, the detailed description is omitted.

Control circuit 1033 includes time setter 955, counter 960, and notifier 970, as is the same as control circuit 1023 according to Embodiment 1. Control circuit 1033 further includes switch 980. Switch 980 switches between: the first mode in which it is determined that a leak of gas is present when a predetermined number is 0; and the second mode in which it is determined that a leak of gas is present when a predetermined number is 1 or greater. In other words, switch 980 has two modes: the first mode in which each time gas sensor 200 is reset, it is determined that hydrogen-containing gas is leaking; and the second mode in which when gas sensor 200 is reset for a predetermined number of times or more, it is determined that hydrogen-containing gas is leaking. In this case, the user may use these modes by switching between the modes or control circuit 1023 may control the switching between these modes.

Thus, by using the first mode when a leak of hydrogen-containing gas is expected to be detected even by malfunction and using the second mode when a damage will be considerable if an emergency stop or the like occurs due to malfunction, it is possible to properly detect a leak of hydrogen-containing gas depending on an environment and conditions in which a gas detection device is used.

Note that the first mode is effective in the detection of a leak of hydrogen-containing gas, for example, in a fuel cell vehicle before travel, or placed in a garage, an enclosed space, or the like. The second mode is effective in the detection of a leak of hydrogen-containing gas, for example, in a hydrogen plant, a hydrogen station, a gas pipe line, or in a fuel cell vehicle that is traveling.

Embodiment 4

Figure 15:
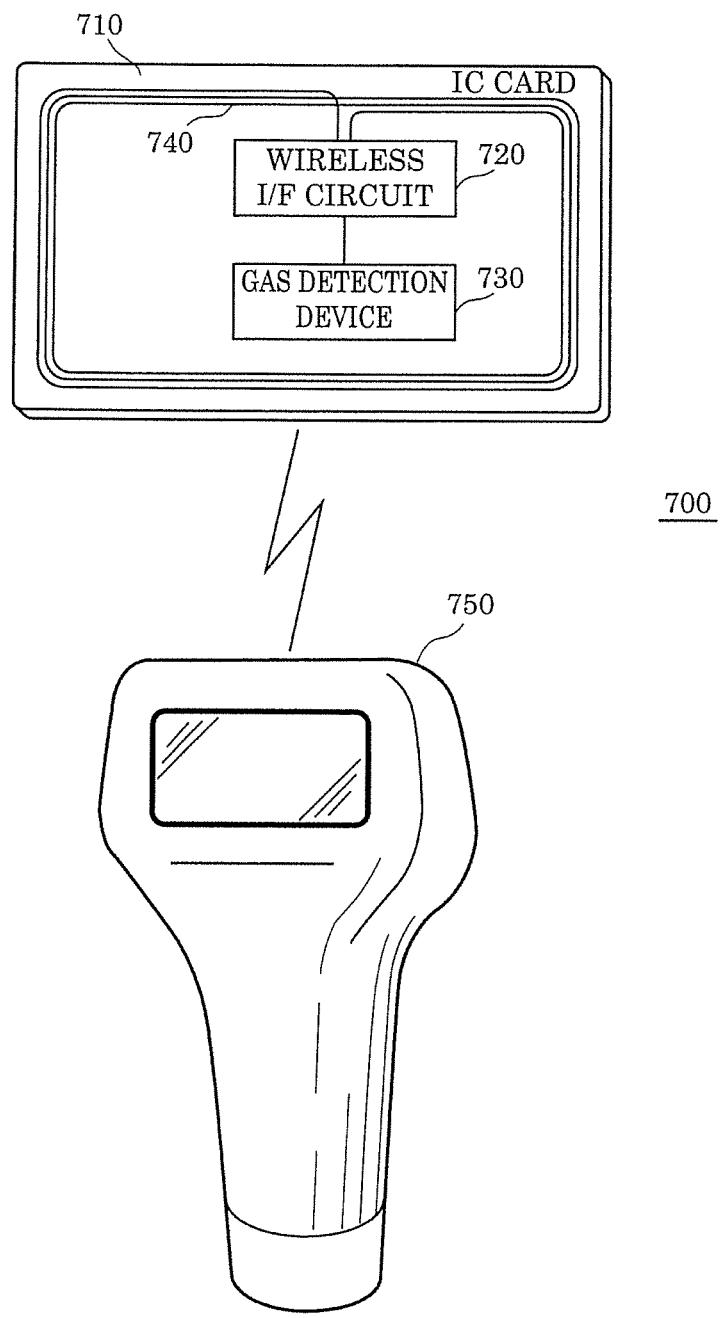
FIG. 15 is a pattern diagram illustrating an example of a configuration of a gas detection system according to Embodiment 4.

Next, Embodiment 4 will be described with reference to FIG. 15. FIG. 15 is a pattern diagram illustrating an example of a configuration of gas sensor system 700 according to this embodiment.

The gas sensor system according to Embodiment 4 includes gas detection device 730 and reader/writer 750, and is a system which performs each operation of hydrogen-containing gas detection, reset, or refreshing performed by gas detection device 730, based on wireless signals and wireless power supplied by reader/writer 750.

As illustrated in FIG. 15, gas sensor system 700 includes IC card 710 and reader/writer 750.

IC card 710 includes wireless interface (I/F) circuit 720, gas detection device 730, and antenna 740.

With the use of antenna 740, wireless I/F circuit 720 receives wireless power from reader/writer 750 and also performs wireless communication with reader/writer 750. In this embodiment, reader/writer 750 is an access device.

Gas detection device 730 is configured using any one of gas detection devices 1010, 1020, and 1030 described in Embodiment 1. Gas detection device 730 performs each operation of hydrogen-containing gas detection, reset, or refreshing, using the power received by wireless I/F circuit 720, and notifies reader/writer 750 of a result of the operation via wireless I/F circuit 720. The operation result to be notified may include a result of the hydrogen-containing gas detection, and may additionally include a failure notice indicating failure in a refreshing operation.

Wireless I/F circuit 720, gas detection device 730, and antenna 740 are provided, for example, inside an opening of a resin substrate, and gas detection device 730 may contact, via the opening, fresh air in the surrounding environment of the resin substrate.

Reader/writer 750 provides IC card 710 with power for operating gas detection device 730 as well as wirelessly receives a result of the operation of gas detection device 730 from IC card 710 and presents the received operation result to the user. A display, buzzer, or vibrator, for example, may be used for the presentation of the operation result.

According to the above-described configuration, a wirelessly-drivable gas detection device is realized in a general form exemplified by IC card 710, with a low cost and a reduced size. Since the power source of gas detection device 730 can be provided without any contacts with others, the device itself cannot be an ignition point and a complicated work for explosion proof is unnecessary. Accordingly, a gas detection system that is simple and easy to install can be attained.

IC card 710 including gas detection device 730 is provided in a place one wants to monitor for gas leaks, for example, in a hydrogen plant, a hydrogen station, a gas pipe line, or in a fuel cell vehicle. A person who monitors carries reader/writer 750 on the body and holds reader/writer 750 over IC card 710 that is placed, to get informed of a gas leak and identify the location of the gas leak. Reader/writer 750 may be carried not only by a person who monitors but also on a drone or a self-operating robot that visits one by one the locations at each of which IC card 710 is placed.

Note that IC card 710 is one example, not a limitation, of a wirelessly-drivable gas detection device, and may be realized in other form where appropriate.

IC card 710 may be embedded in a power source such as a button cell, perform each operation of hydrogen-containing gas detection, reset, or refreshing at all times, and notify a master device, such as reader/writer 750 or a tablet terminal, of a result of the operation via wireless I/F circuit 720.

Embodiment 5

Figure 16:
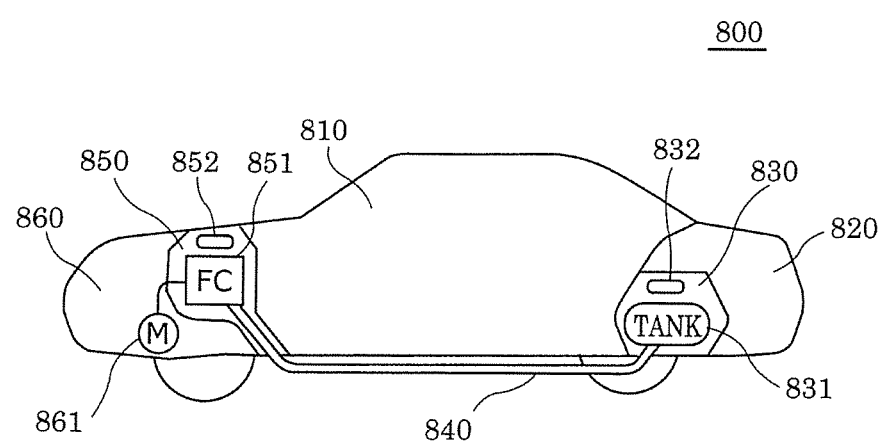
FIG. 16 is a pattern diagram illustrating an example of a configuration of a fuel cell vehicle according to Embodiment 5.

Next, Embodiment 5 will be described with reference to FIG. 16. FIG. 16 is a pattern diagram illustrating an example of a configuration of fuel cell vehicle 800 according to this embodiment.

The fuel cell vehicle according to Embodiment 5 includes any of the gas sensors described in Embodiment 1, and detects hydrogen gas in a vehicle, using the gas sensor.

As illustrated in FIG. 16, fuel cell vehicle 800 includes passenger compartment 810, luggage compartment 820, gas tank compartment 830, fuel tank 831, pipe 840, fuel cell compartment 850, fuel cell 851, gas sensor 852, motor compartment 860, and motor 861.

Fuel tank 831 is placed in gas tank compartment 830 and preserves hydrogen gas as fuel gas. Gas sensor 832 detects a leak of fuel gas in gas tank compartment 830.

Fuel cell 851 includes a fuel cell stack composed of stacked cells each being a base unit including a fuel electrode, an air electrode, and an electrolyte. Fuel cell 851 is placed in fuel cell compartment 850. Hydrogen gas in fuel tank 831 is sent to fuel cell 851 in fuel cell compartment 850 through pipe 840. Fuel cell 851 generates electric power by allowing this hydrogen gas to react, in fuel cell 851, with oxygen gas in the atmosphere. Gas sensor 852 detects a leak of hydrogen gas in fuel cell compartment 850.

Motor 861 is placed in motor compartment 860. The electric power generated by fuel cell 851 rotates motor 861, and thereby, fuel cell vehicle 800 travels.

As described above, with the gas sensor according to the present disclosure, it is possible to detect hydrogen-containing gas using a very low power consumption of approximately 0.01 mV, for example. Accordingly, it is possible to monitor for hydrogen gas leaks at all times by utilizing excellent power saving capability of the gas sensor, without significantly increasing the stand-by power of the fuel cell vehicle.

For example, a predetermined voltage may be applied at all times to gas sensors 832 and 852, regardless of the operation state of the ignition key of fuel cell vehicle 800. In such a case, whether hydrogen gas is present outside fuel tank 831 in gas tank compartment 830 and outside fuel cell 851 in fuel cell compartment 850 may be determined based on the amounts of the currents flowing through gas sensors 832 and 852.

Accordingly, whether a hydrogen gas leak is present has already been determined at the time when the operation of the ignition key is received, for example. The start-up time of the fuel cell vehicle can be shortened, compared to the case of driving the gas sensor for determining whether a hydrogen gas leak is present after the operation of the ignition key has been received. In addition, the safety of the fuel cell vehicle can be enhanced by continuously monitoring for hydrogen gas leaks after the fuel cell vehicle started traveling and even after the fuel cell vehicle has been housed in a garage, for example.

[Supplementary Notes]

As illustrated in FIG. 5, gas sensor 200 includes first electrode 103, resistive film 204 disposed on first electrode 103, and second electrode 106 disposed on resistive film 204. Resistive film 204 is one example of "metal-oxide layer" of the present disclosure. Resistive film 204 includes first metal-oxide layer 204a and second metal-oxide layer 204b. Resistive film 204 includes local region 105 and a bulk region surrounding local region 105. Here, "surrounding local region 105" does not exclusively means surrounding all of outer lateral surfaces of local region 105. In FIG. 5, a bulk region is a region other than local region 105 in second metal-oxide layer 204b. Local region 105 has a degree of oxygen deficiency higher than that of the bulk region. First metal-oxide layer 204a has a degree of oxygen deficiency higher than that of the bulk region. In FIG. 5, local region 105 is in contact with second electrode 106, penetrates through second metal-oxide layer 204b, and is not in contact with first electrode 103.

In FIG. 5, insulating film 107 has opening 107a. In opening 107a, part of the main surface of second electrode 106 is exposed from insulating film 107. The exposed surface of second electrode 106 is allowed to contact gas.

When gas containing hydrogen atoms is brought into contact with second electrode 106, a resistance value of local region 105 decreases, a resistance value of resistive film 204 decreases, and a resistance value of gas sensor 200 decreases.

In power supply circuit 1012, a predetermined voltage is applied between first electrode 103 and second electrode 106 before the resistance value of resistive film 204 decreases, for example, and thereby, the resistance value of resistive film 204 increases. For example, the resistive state of resistive film 204 is set to a high-resistance state by a voltage applied, and subsequently transitions to a low-resistance state in response to hydrogen-containing gas. Alternatively, power supply circuit 1012 applies a predetermined voltage between first electrode 103 and second electrode 106 after the resistance value of resistive film 204 has decreased, for example, and thus increases the resistance value of resistive film 204. For example, the resistive state of resistive film 204 transitions to a low-resistance state in response to hydrogen-containing gas, and is subsequently set to a high-resistance state by a voltage applied. Alternatively, the resistive state of resistive film 204 may be set to a high-resistance state by a voltage applied, subsequently transition to a low-resistance state in response to hydrogen-containing gas, and after that, be reset again to the high-resistance state by a voltage applied.

[Overview of Embodiments]

The gas detection device according to one aspect of the present disclosure includes: a gas sensor; a power supply circuit that applies a predetermined voltage to the gas sensor; and a determiner that determines whether a leak of gas is present. The gas sensor includes: a first electrode; a second electrode; a metal-oxide layer that is disposed between the first electrode and the second electrode, and includes a bulk region and a local region surrounded by the bulk region, the local region having a degree of oxygen deficiency higher than a degree of oxygen deficiency of the bulk region; and an insulating film that covers the first electrode, the second electrode, and the metal-oxide layer, and has an opening that exposes part of a main surface of the second electrode. The metal-oxide layer has reversible resistance change characteristics of transitioning from a low-resistance state to a high-resistance state by a first voltage being applied, and transitioning from the high-resistance state to the low-resistance state by a second voltage being applied, the second voltage being different from the first voltage. A resistance value of the metal-oxide layer decreases when the gas contacts the second electrode, the gas containing hydrogen atoms. The power supply circuit includes a first power supply circuit that generates the first voltage, and a second power supply circuit that generates a detection voltage for measuring the resistance value of the metal-oxide layer. The power supply circuit applies the first voltage between the first electrode and the second electrode by the first power supply circuit to perform a reset of resetting the metal-oxide layer to the high-resistance state, when a current flowing through the metal-oxide layer has a predetermined value or greater. The determiner determines that a leak of the gas is present, depending on a state in which the reset is performed after the reset has been performed for a first time.

With such a configuration, the gas detection device having a reset function determines that a gas leak is present, depending on a state in which a reset is performed, e.g., a time period until the next reset is performed after the first reset, the number of times a reset is performed after the first reset. Accordingly, the gas detection device is capable of distinguishing between error detection due to disturbance or the like and detection of a gas leak, and thus inhibiting the error detection of hydrogen-containing gas caused by disturbance or the like.

The determiner may include a time setter that sets a waiting time which is a time until the reset is performed next after the reset has been performed for the first time, and determine that a leak of the gas is present, when the reset is performed again within the waiting time set by the time setter.

With such a feature, by setting a waiting time depending on an environment and conditions in which the gas detection device is used, it is possible to properly detect a leak of hydrogen-containing gas depending on the environment and the conditions.

The determiner may include a counter that counts the number of times the reset is performed after the reset has been performed for the first time, and determine that a leak of the gas is present, when the number of times the reset is performed, which is counted by the counter, is a predetermined number or greater within a predetermined period after the reset has been performed for the first time.

With such a feature, by setting a predetermined number of times depending on an environment and conditions in which the gas detection device is used, it is possible to properly detect a leak of hydrogen-containing gas depending on the environment and the conditions.

The predetermined number may be 1 or greater.

With such a feature, by performing a reset for at least two times, it is possible to distinguish between error detection due to disturbance or the like and detection of a leak of hydrogen-containing gas, and thus detect a leak of hydrogen-containing gas.

The determiner may further include a switch that switches between a first mode and a second mode. The first mode is a mode in which it is determined that a leak of the gas is present when the predetermined number is 0. The second mode is a mode in which it is determined that a leak of the gas is present when the predetermined number is 1 or greater.

With such a feature, by using the first mode when a leak of hydrogen-containing gas is expected to be detected even by malfunction and using the second mode when a damage will be considerable if an emergency stop or the like occurs due to malfunction, it is possible to properly detect a leak of hydrogen-containing gas depending on an environment and conditions in which the gas detection device is used.

The gas detection device may further include a current meter. When the first power supply circuit is applying the detection voltage between the first electrode and the second electrode, the current meter may measure a value of a current flowing between the first electrode and the second electrode as a current flowing through the metal-oxide layer.

With such a feature, it is possible to detect hydrogen-containing gas by an increase in the current measured by the current meter.

An absolute value of the detection voltage may be less than an absolute value of the first voltage.

With such a feature, by applying, between the first electrode and the second electrode, a minimum voltage appropriate for current measurement and a change to a high resistance sate (a reset operation), it is possible to attain a gas sensor that is highly capable of saving power.

The power supply circuit may further include a switch that switches between the first power supply circuit and the second power supply circuit, to either of which the gas sensor is to be connected.

With such a feature, a highly convenient gas sensor can be attained as a module component including power sources for current measurement and a change to a high-resistance state (a reset operation), respectively.

The part of the main surface of the second electrode may be provided to allow the gas to contact the part.

With such a feature, since gas is easily brought into contact with the main surface of the second electrode, it is possible to attain a gas sensor capable of easily detecting hydrogen-containing gas.

The metal-oxide layer may comprise a first metal-oxide layer that is in contact with the first electrode and have a degree of oxygen deficiency higher than the degree of oxygen deficiency of the bulk region, and a second metal-oxide layer that is in contact with the second electrode and includes the bulk region. The local region may be in contact with the second electrode and penetrate through the second metal-oxide layer.

With such a configuration, by applying a layered structure having excellent resistance change characteristics to the metal-oxide layer, it is possible to attain a gas sensor highly capable of detecting hydrogen-containing gas.

The second electrode may cause the hydrogen atoms to be dissociated from molecules contained in the gas.

With such a feature, hydrogen atoms are dissociated from hydrogen molecules in a portion where the second electrode is in contact with a local region, and the dissociated hydrogen atoms bond with oxygen atoms in the local region in a metal-oxide layer, and this reduces a resistance value between the first electrode and the second electrode.

The second electrode may include at least one selected from a group consisting of platinum, palladium, and iridium.

With such a feature, the second electrode is capable of causing hydrogen atoms to be dissociated from hydrogen molecules by a catalytic action of platinum or palladium.

The metal-oxide layer may include at least one of a transition metal oxide or an aluminum oxide.

With such a feature, it is possible to attain a gas sensor that is highly capable of detecting hydrogen-containing gas since the metal-oxide layer includes a transition metal oxide or an aluminum oxide having excellent resistance change characteristics.

The transition metal oxide may be a tantalum oxide, a hafnium oxide, or a zirconium oxide.

With such a feature, it is possible to attain a gas sensor that is highly capable of detecting hydrogen-containing gas since a tantalum oxide, a hafnium oxide, or a zirconium oxide having excellent resistance change characteristics is used for the transition metal oxide.

The gas sensor system according to one aspect of the present disclosure includes: the gas detection device having the above-described features; a wireless interface circuit that is connected to the gas detection device and wirelessly communicable with an external device; and an access device that obtains, through wireless communication, the resistance value of the metal-oxide layer in the gas detection device via the wireless interface circuit.

With such a method, it is possible to provide a gas sensor system capable of properly detecting a leak of hydrogen-containing gas depending on an environment and conditions in which the gas detection device is used.

The fuel cell vehicle according to one aspect of the present disclosure includes: a passenger compartment; a gas tank compartment in which a hydrogen gas tank is placed; a fuel cell compartment in which a fuel cell is placed; and the gas detection device having the above-described features. The gas detection device is placed in at least one of the gas tank compartment or the fuel cell compartment.

With such a method, since a leak of hydrogen-containing gas can be properly detected depending on an environment and conditions in which the gas detection device is used, it is possible to provide a safe and effective fuel cell vehicle.

The hydrogen detection method according to one aspect of the present disclosure is a gas detection method using a gas sensor. The gas sensor includes: a first electrode; a second electrode; a metal-oxide layer that is disposed between the first electrode and the second electrode, and includes a bulk region and a local region surrounded by the bulk region, the local region having a degree of oxygen deficiency higher than a degree of oxygen deficiency of the bulk region; and an insulating film that covers the first electrode, the second electrode, and the metal-oxide layer, and has an opening that exposes part of a main surface of the second electrode. The gas detection method includes: detecting gas containing hydrogen atoms by detecting a decrease in a resistance value of the metal-oxide layer; after the detecting of the gas, applying a predetermined voltage between the first electrode and the second electrode to perform, for a first time, a reset of increasing the resistance value of the metal-oxide layer; and determining that a leak of the gas is present, when the reset is performed again within a predetermined period after the reset has been performed for the first time.

With such a feature, by changing a time period until the next reset is performed after the first reset, it is possible to properly detect a leak of hydrogen-containing gas depending on an environment and conditions in which the gas sensor is used.

The hydrogen detection method according to one aspect of the present disclosure is a gas detection method using a gas sensor. The gas sensor includes: a first electrode; a second electrode; a metal-oxide layer that is disposed between the first electrode and the second electrode, and includes a bulk region and a local region surrounded by the bulk region, the local region having a degree of oxygen deficiency higher than a degree of oxygen deficiency of the bulk region; and an insulating film that covers the first electrode, the second electrode, and the metal-oxide layer, and has an opening that exposes part of a main surface of the second electrode. The gas detection method includes: detecting gas containing hydrogen atoms by detecting a decrease in a resistance value of the metal-oxide layer; after the detecting of the gas, applying a predetermined voltage between the first electrode and the second electrode to perform, for a first time, a reset of increasing the resistance value of the metal-oxide layer; and determining that a leak of the gas is present, when the reset is performed again a predetermined number of times within a predetermined period after the reset has been performed for the first time.

With such a method, by changing the number of times a gas sensor is reset, it is possible to inhibit malfunction in detecting hydrogen-containing gas, and thus properly detect a leak of hydrogen-containing gas depending on an environment and conditions in which the gas sensor is used.

INDUSTRIAL APPLICABILITY

A gas detection device according to the present disclosure is useful, for example, for use in fuel cell vehicles, hydrogen stations, hydrogen plants, etc.

REFERENCE MARKS IN THE DRAWINGS

100, 200, 832, 852 gas sensor
101 substrate
102 insulating film
103 first electrode
104, 204 resistive film
105 local region
106 second electrode
107 insulating film
107a opening
107b via hole
108 via
109 wiring
204a first metal-oxide layer
204b second metal-oxide layer
300 mask
408 conductive film
700 gas sensor system
710 IC card
720 wireless I/F circuit
730 gas detection device
740 antenna
750 reader/writer (access device)
800 fuel cell vehicle
810 passenger compartment
820 luggage compartment
830 gas tank compartment
831 fuel tank
840 pipe
850 fuel cell compartment
851 fuel cell
860 motor compartment
861 motor
900 evaluation system
910 airtight container
911 hydrogen cylinder
912 nitrogen cylinder
913, 914 introduction valve
915 exhaust valve
920 detection power source (second power supply circuit)
930 current meter
940 reset power source (first power supply circuit)
950 switch
955 time setter
960 counter
970 notifier
980 switch
1010, 1020, 1030 gas detection device
1011 measurement circuit
1012, 1022 power supply circuit
1023, 1033 control circuit (determiner)

The invention claimed is:

1. A gas detection device, comprising:
a gas sensor;
a power supply circuit that applies a predetermined voltage to the gas sensor; and
a determiner that determines whether a leak of gas is present, wherein
the gas sensor includes:
a first electrode;
a second electrode;
a metal-oxide layer that is disposed between the first electrode and the second electrode, and includes a bulk region and a local region surrounded by the bulk region, the local region having a degree of oxygen deficiency higher than a degree of oxygen deficiency of the bulk region; and
an insulating film that covers the first electrode, the second electrode, and the metal-oxide layer, and has an opening that exposes part of a main surface of the second electrode,
the metal-oxide layer has reversible resistance change characteristics of transitioning from a low-resistance state to a high-resistance state by a first voltage being applied, and transitioning from the high-resistance state to the low-resistance state by a second voltage being applied, the second voltage being different from the first voltage,
a resistance value of the metal-oxide layer decreases when the gas contacts the second electrode, the gas containing hydrogen atoms,
the power supply circuit:
includes a first power supply circuit that generates the first voltage, and a second power supply circuit that generates a detection voltage for measuring the resistance value of the metal-oxide layer, and
applies the first voltage between the first electrode and the second electrode by the first power supply circuit to perform a reset of resetting the metal-oxide layer to the high-resistance state, when a current flowing through the metal-oxide layer has a predetermined value or greater, and
the determiner determines that the leak of the gas is present, depending on a state in which the reset is performed after the reset has been performed for a first time.

2. The gas detection device according to claim 1, wherein the determiner:
includes a time setter that sets a waiting time which is a time until the reset is performed next after the reset has been performed for the first time, and
determines that the leak of the gas is present, when the reset is performed again within the waiting time set by the time setter.

3. The gas detection device according to claim 1, wherein the determiner:
includes a counter that counts the number of times the reset is performed after the reset has been performed for the first time, and
determines that the leak of the gas is present, when the number of times the reset is performed, which is counted by the counter, is a predetermined number or greater within a predetermined period after the reset has been performed for the first time.

4. The gas detection device according to claim 3, wherein the predetermined number is 1 or greater.

5. The gas detection device according to claim 3, wherein the determiner further includes a switch that switches between a first mode and a second mode, the first mode being a mode in which it is determined that the leak of the gas is present when the predetermined number is 0, the second mode being a mode in which it is determined that the leak of the gas is present when the predetermined number is 1 or greater.

6. The gas detection device according to claim 1, further comprising:
a current meter, wherein
when the second power supply circuit is applying the detection voltage between the first electrode and the second electrode, the current meter measures a value of a current flowing between the first electrode and the second electrode as a current flowing through the metal-oxide layer.

7. The gas detection device according to claim 1, wherein an absolute value of the detection voltage is less than an absolute value of the first voltage.

8. The gas detection device according to claim 1, wherein the power supply circuit further includes a switch that switches between the first power supply circuit and the second power supply circuit, to either of which the gas sensor is to be connected.

9. The gas detection device according to claim 1, wherein the part of the main surface of the second electrode is provided to allow the gas to contact the part.

10. The gas detection device according to claim 1, wherein
the metal-oxide layer comprises a first metal-oxide layer that is in contact with the first electrode and has a degree of oxygen deficiency higher than the degree of oxygen deficiency of the bulk region, and a second metal-oxide layer that is in contact with the second electrode and includes the bulk region, and
the local region is in contact with the second electrode and penetrates through the second metal-oxide layer.

11. The gas detection device according to claim 1, wherein the second electrode causes the hydrogen atoms to be dissociated from molecules contained in the gas.

12. The gas detection device according to claim 1, wherein the second electrode includes at least one selected from a group consisting of platinum, palladium, and iridium.

13. The gas detection device according to claim 1, wherein the metal-oxide layer includes at least one of a transition metal oxide or an aluminum oxide.

14. The gas detection device according to claim 13, wherein the transition metal oxide is a tantalum oxide, a hafnium oxide, or a zirconium oxide.

15. A gas detection system, comprising:
the gas detection device according to claim 1;
a wireless interface circuit that is connected to the gas detection device and wirelessly communicable with an external device; and
an access device that obtains, through wireless communication, the resistance value of the metal-oxide layer in the gas detection device via the wireless interface circuit.

16. A fuel cell vehicle, comprising:
a passenger compartment;
a gas tank compartment in which a hydrogen gas tank is placed;
a fuel cell compartment in which a fuel cell is placed; and
the gas detection device according to claim 1, wherein
the gas detection device is placed in at least one of the gas tank compartment or the fuel cell compartment.

17. A gas detection method using a gas sensor,
the gas sensor including:
a first electrode;
a second electrode;
a metal-oxide layer that is disposed between the first electrode and the second electrode, and includes a bulk region and a local region surrounded by the bulk region, the local region having a degree of oxygen deficiency higher than a degree of oxygen deficiency of the bulk region; and
an insulating film that covers the first electrode, the second electrode, and the metal-oxide layer, and has an opening that exposes part of a main surface of the second electrode,
the gas detection method comprising:
detecting gas containing hydrogen atoms by detecting a decrease in a resistance value of the metal-oxide layer;
after the detecting of the gas, applying a predetermined voltage between the first electrode and the second electrode to perform, for a first time, a reset of increasing the resistance value of the metal-oxide layer; and
determining that a leak of the gas is present, when the reset is performed again within a predetermined period after the reset has been performed for the first time.

18. A gas detection method using a gas sensor,
the gas sensor including:
a first electrode;
a second electrode;
a metal-oxide layer that is disposed between the first electrode and the second electrode, and includes a bulk region and a local region surrounded by the bulk region, the local region having a degree of oxygen deficiency higher than a degree of oxygen deficiency of the bulk region; and
an insulating film that covers the first electrode, the second electrode, and the metal-oxide layer, and has an opening that exposes part of a main surface of the second electrode,
the gas detection method comprising:
detecting gas containing hydrogen atoms by detecting a decrease in a resistance value of the metal-oxide layer;
after the detecting of the gas, applying a predetermined voltage between the first electrode and the second electrode to perform, for a first time, a reset of increasing the resistance value of the metal-oxide layer; and
determining that a leak of the gas is present, when the reset is performed again a predetermined number of times within a predetermined period after the reset has been performed for the first time.

\* \* \* \* \*